(12) United States Patent
Huang et al.

(10) Patent No.: US 11,342,408 B2
(45) Date of Patent: May 24, 2022

(54) METAL-INSULATOR-METAL STRUCTURE AND METHODS OF FABRICATION THEREOF

(71) Applicant: Taiwan Semiconductor Manufacturing Co., Ltd., Hsin-Chu (TW)

(72) Inventors: Chih-Fan Huang, Kaohsiung (TW); Hung-Chao Kao, Taipei (TW); Yuan-Yang Hsiao, Taipei (TW); Tsung-Chieh Hsiao, Changhua County (TW); Hsiang-Ku Shen, Hsinchu (TW); Hui-Chi Chen, Hsinchu County (TW); Dian-Hau Chen, Hsinchu (TW); Yen-Ming Chen, Hsin-Chu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/983,880

(22) Filed: Aug. 3, 2020

(65) Prior Publication Data
US 2020/0365683 A1  Nov. 19, 2020

Related U.S. Application Data

(62) Division of application No. 16/156,779, filed on Oct. 10, 2018, now Pat. No. 10,734,474.

(51) Int. Cl.
*H01L 49/02* (2006.01)
*H01L 21/311* (2006.01)
(Continued)

(52) U.S. Cl.
CPC ........ *H01L 28/60* (2013.01); *H01L 21/31116* (2013.01); *H01L 27/224* (2013.01)

(58) Field of Classification Search
CPC ....... H01L 21/02019; H01L 21/30604–30621; H01L 21/3063–30635; H01L 21/3065–30655; H01L 21/31055–31056; H01L 21/31111–31122; H01L 21/31133–31138; H01L 21/32133–32139; H01L 21/465; H01L 21/31116; H01L 21/31122; H01L 21/31138; H01L 21/67069; H01L 21/32136–32137; H01L 21/02071; H01L 28/40–92; H01L 29/7408; H01L 2924/1205; H01L 2924/19041;
(Continued)

(56) References Cited

U.S. PATENT DOCUMENTS 8,772,109 B2  7/2014 Colinge
8,785,285 B2  7/2014 Tsai et al.
(Continued)

*Primary Examiner* — Sonya McCall-Shepard
(74) *Attorney, Agent, or Firm* — Haynes and Boone, LLP

(57) ABSTRACT

The present disclosure is directed to a method of fabrication a semiconductor structure. The method includes providing a substrate and forming a bottom electrode over the substrate, wherein a terminal end of the bottom electrode has a tapered sidewall. The method also includes depositing an insulating layer over the bottom electrode and forming a top electrode over the insulating layer, wherein a terminal end of the top electrode has a vertical sidewall.

20 Claims, 24 Drawing Sheets

Related U.S. Application Data

(60) Provisional application No. 62/711,711, filed on Jul. 30, 2018.

(51) Int. Cl.
*H01L 27/22* (2006.01)
*H01L 21/3213* (2006.01)
*H01L 21/768* (2006.01)
*H01L 23/522* (2006.01)

(58) Field of Classification Search
CPC ............ H01L 27/0288; H01L 27/0629; H01L 27/0635; H01L 27/0647–0652; H01L 27/067–0682; H01L 27/0711–0733; H01L 27/075–0755; H01L 27/0777; H01L 27/0783–0794; H01L 27/0805–0811; H01L 27/101; H01L 2027/11842; C23F 1/00–46; H01J 2237/334–3348; H01G 4/00–40; H01G 9/00–28
See application file for complete search history.

(56) References Cited

U.S. PATENT DOCUMENTS

| | | |
|---|---|---|
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 2003/0015742 A1* | 1/2003 | Ogawa ............... H01L 27/10894 257/296 |
| 2010/0044831 A1* | 2/2010 | Guegan ................... H01L 28/60 257/532 |
| 2010/0091424 A1* | 4/2010 | Loh ......................... H01L 28/40 361/301.4 |
| 2010/0224960 A1* | 9/2010 | Fischer ............... H01L 23/5223 257/532 |
| 2012/0001243 A1 | 1/2012 | Kato |
| 2012/0275080 A1 | 11/2012 | Dunn et al. |
| 2014/0159200 A1 | 6/2014 | Loke et al. |
| 2016/0099302 A1 | 4/2016 | Seidel et al. |
| 2016/0104762 A1 | 4/2016 | Triyoso et al. |
| 2019/0096986 A1 | 3/2019 | Hsu et al. |
| 2019/0103352 A1 | 4/2019 | Chou |
| 2019/0305078 A1 | 10/2019 | Wu et al. |

* cited by examiner

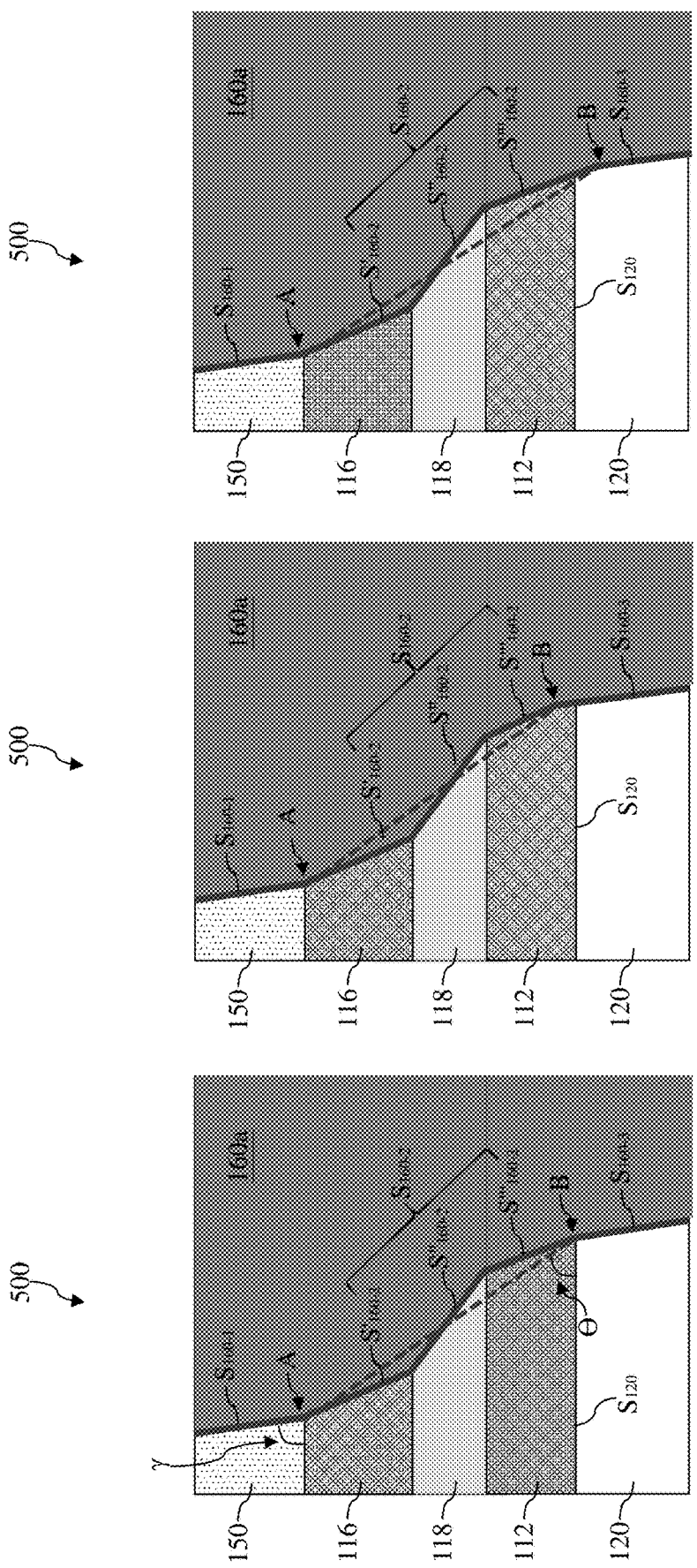

METAL-INSULATOR-METAL STRUCTURE AND METHODS OF FABRICATION THEREOF

PRIORITY DATA

This is a divisional application of U.S. patent application Ser. No. 16/156,779, filed Oct. 10, 2018, which claims priority to U.S. Provisional Patent Application Ser. No. 62/711,711 filed Jul. 30, 2018, the entire disclosure of which is hereby incorporated herein by reference.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Many of the technological advances in semiconductors have occurred in the field of memory devices, and some of these involve capacitive structures. Capacitive structures are components for many data manipulation and data storage applications. Such capacitive structures include two conductive electrodes on opposing sides of a dielectric or other insulating layer, and they may be categorized based on the materials employed to form the electrodes. For example, in metal-insulator-metal (MIM) capacitors, the electrodes are substantially metal. MIM capacitors offer the advantage of a relatively constant value of capacitance over a relatively wide range of voltages applied thereto. MIM capacitors also exhibit a relatively small parasitic resistance. MIM capacitors are compatible with CMOS fabrication processes. Current fabrication methods and structures, while suitable in many respects, can struggle to meet the desired performance and reliability criteria, such as frequency response and breakdown voltage tailing. Therefore, further improvements in this area are needed.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 14, 15, 16, 17, 18, 19, 20, 21, 22, 23, and 24 illustrate sectional side views of a semiconductor structure during a fabrication process according to the method of FIG. 13, in accordance with an embodiment.

DETAILED DESCRIPTION

Figure 1:
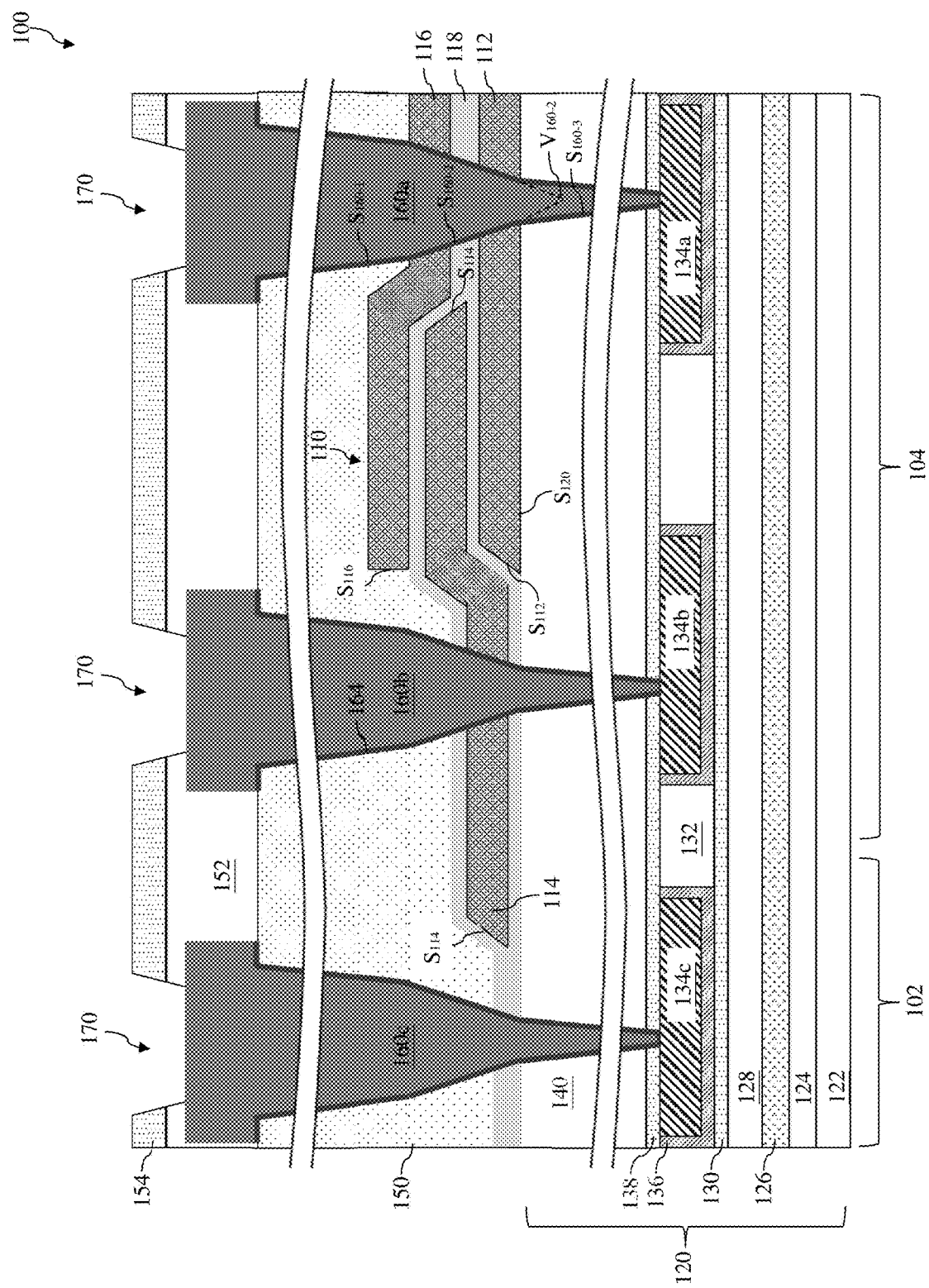
FIG. 1 illustrates a sectional side view of a semiconductor device incorporating a metal-insulator-metal (MIM) structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to semiconductor devices and fabrication methods. More particularly, the present disclosure is related to a metal-insulator-metal (MIM) structure, a method of manufacturing the structure, and a semiconductor device incorporating the structure.

FIG. 1 is a diagrammatic sectional side view of a semiconductor device 100. The semiconductor device 100 may be an intermediate device fabricated during processing of an integrated circuit (IC) that may comprise static random access memory (SRAM) and/or logic circuits, passive components such as resistors, capacitors, and inductors, and active components such as p-type FETs (pFETs), n-type FETs (nFETs), FinFETs, metal-oxide semiconductor field effect transistors (MOSFET), and complementary metal-oxide semiconductor (CMOS) transistors, bipolar transistors, high voltage transistors, high frequency transistors, other memory cells, and combinations thereof. Furthermore, the various features including transistors, gate stacks, active regions, isolation structures, and other features in various embodiments of the present disclosure are provided for simplification and ease of understanding and do not necessarily limit the embodiments to any types of devices, any number of devices, any number of regions, or any configuration of structures or regions.

In the illustrated embodiment, the semiconductor device 100 is configured as a system-on-chip (SoC) device that integrates various functions on a single chip. In one or more embodiments, the semiconductor device 100 includes regions 102 and 104 that are each configured for a different function. In one embodiment, the region 102 is a logic region and the region 104 is a memory region. The region 102 may include transistors forming part of a logic circuit, processor circuit, or other suitable circuits, for controlling reading and writing functions to memory units in the region 104. The region 104 may include a plurality of transistors and MIM capacitors 110 forming memory units for memory storage, such as dynamic random access memory (DRAM) units, non-volatile memory (NVM) units, resistive random-access memory (RRAM) units, or other suitable memory units. In one or more embodiments, the MIM capacitor 110 may be used for various other functions, such as a decoupling capacitor or a high-frequency noise filtering capacitor in mixed-signal applications. The MIM capacitor 110 may also be used in oscillators, phase-shift networks, bypass filters, or as a coupling capacitor in radio frequency (RF) applications. It is understood that the semiconductor device 100 may include other features and structures such as e-fuses, inductors, passivation layers, bonding pads, and packaging, but is simplified in FIG. 1 for the sake of simplicity and clarity.

The semiconductor device 100 includes a semiconductor substrate 120. In one or more embodiments, the semiconductor substrate 120 includes a bottom substrate 122 in a crystalline structure, such as a silicon wafer. Alternatively, the bottom substrate 122 may comprise another elementary semiconductor, such as germanium; a compound semiconductor including silicon carbide, gallium nitride, gallium arsenide, gallium phosphide, indium phosphide, indium arsenide, and indium antimonide; an alloy semiconductor including silicon germanium, gallium arsenide phosphide, aluminum indium phosphide, aluminum gallium arsenide, gallium indium arsenide, gallium indium phosphide, and gallium indium arsenide phosphide; or combinations thereof. In another embodiment, the bottom substrate 122 includes indium tin oxide (ITO) glass.

The bottom substrate 122 may include various doping configurations depending on design requirements as is known in the art (e.g., p-type substrate or n-type substrate). Additionally, the bottom substrate 122 may include various doped regions such as p-type wells (p-wells or PW) or n-type wells (n-wells or NW). Further, the bottom substrate 122 may optionally include an epitaxial layer (epi-layer), may be strained for performance enhancement, and may include a silicon-on-insulator (SOI) structure.

The bottom substrate 122 may further include isolation structures such as shallow trench isolation (STI) features to isolate one or more devices. The STI features may include silicon oxide, silicon nitride, silicon oxynitride, fluoride-doped silicate (FSG), and/or a low-k dielectric material known in the art. Other isolation methods and/or features are possible in lieu of or in addition to STI. The STI features may be formed by reactive ion etching (RIE) the bottom substrate 122 to form trenches, which are then filled with an insulator material by a deposition process and leveled with a chemical-mechanical-polishing (CMP) process.

Further, an interlayer dielectric (ILD) layer 124 covers the aforementioned features in the bottom substrate 122. The ILD layer 124 may be formed of silicon oxide or a low-k dielectric material. The ILD layer 124 may comprise tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 124 may be formed by PECVD (plasma enhanced CVD), FCVD (flowable CVD), or other suitable methods. In some embodiments, the ILD layer 124 has a thickness ranging from about 100 nm to about 400 nm, such as about 200 nm.

The semiconductor substrate 120 further includes one or more dielectric layers stacked above the ILD layer 124, such as a protective dielectric layer 126, inter-metal dielectric (IMD) layers 128 and 132, and an etch stop layer 130 interposed therebetween. The protective dielectric layer 126 may comprise silicon carbide for protecting the ILD layer 124. In some embodiments, the protective dielectric layer 126 has a thickness ranging from about 20 nm to about 200 nm, such as about 55 nm. The etch stop layer 130 may comprise silicon nitride, silicon oxynitride, and/or other suitable materials. In some embodiments, the etch stop layer 130 has a thickness ranging from about 25 nm to about 100 nm, such as about 50 nm. The IMD layers 128 and 132 may comprise silicon oxide, undoped silicate glass (USG), and/or other suitable materials. In some embodiments, each IMD layer has a thickness ranging from about 300 nm to about 1800 nm. In a specific embodiment, the IMD layer 128 has a thickness about 620 nm and the IMD layer 132 has a thickness about 900 nm. The semiconductor substrate 120 may include a plurality of IMD layers, not limited to the two IMD layers 128 and 132 illustrated in the present embodiment. The IMD layers provide electrical insulation as well as structural support for a multi-layer interconnect structure.

The multi-layer interconnect structure may include a plurality of metallization layers and may further include vias or contacts of the interconnect feature (e.g., back-end-of-the-line (BEOL) features) disposed in the semiconductor substrate 120. For example, an upper metallization layer (e.g., metal 4 (M4), metal 5 (M5), etc.) includes a plurality of conductive features (e.g., conductive line, contact, or via) 134 embedded in the IMD layer 132. In a specific embodiment, the IMD layer 132 is a top IMD layer and the conductive features 134 (e.g., 134a-c) are conductive lines as a part of the top metallization layer, such as the fifth (M5) level of the BEOL metallization; however, other locations are also possible. In an embodiment, the conductive features 134 comprises copper. Other examples include W, Al, Ti, Ta, and/or other suitable conductive compositions. The conductive features 134 may be formed by suitable photolithography, etching, and deposition processes, such as chemical vapor deposition (CVD) or physical vapor deposition (PVD). In yet one embodiment, the formation of the conductive features 134 may include a single damascene process or a dual damascene process.

In an embodiment, the top metallization layer further includes a barrier layer 136 interposed between the conductive features 134 and the IMD layer 132. The barrier layer 136 may include TaN, TiN, HfN, ZrN, WN, NbN, MoN, combinations thereof, and/or other suitable conductive material. The barrier layer 136 may be formed by chemical vapor deposition (CVD), atomic layer deposition (ALD), physical vapor deposition (PVD), plating, and/or other suitable deposition processes.

The multi-layer interconnect structure provides interconnections among the various devices and features in the regions 102 and 104. It is understood that the present disclosure does not limit the specific interconnection of the logic devices to each other or to an MIM capacitor or to a memory unit. Those ordinarily skilled in the art will recognize that there are myriad applications, structures, device layouts and interconnection schemes in which an MIM capacitor in accordance with some embodiments of the present disclosure may be implemented. Accordingly, for the sake of simplicity and clarity, additional details of logic devices, memory units, and the interconnections between and among the various devices are not illustrated herein.

The semiconductor substrate 120 also includes an etch stop layer 138 covering the conductive features 134 and the IMD layer 132. The etch stop layer 138 may comprise silicon nitride, silicon oxynitride, and/or other suitable materials. In some embodiments, the etch stop layer 138 has a thickness ranging from about 25 nm to about 150 nm, such as about 75 nm. In one embodiment, the etch stop layer 138 is thicker than the etch stop layer 130, such as about 25 nm thicker.

The semiconductor substrate 120 further includes a dielectric layer 140 covering the etch stop layer 138. The dielectric layer 140 may comprise plasma-enhanced oxide (PEOX), plasma-enhanced SiN (PE-SiN), undoped silicate glass (USG), plasma-enhanced USG (PE-USG), or the like. The dielectric layer 140 may be formed by PECVD, FCVD, or other suitable methods. In some embodiments, the dielectric layer 140 has a thickness ranging from about 200 nm to about 1000 nm, such as about 400 nm.

Still referring to FIG. 1, the MIM capacitor 110 in the region 104 includes a bottom electrode 112, a middle electrode 114, a top electrode 116, and an insulating dielectric layer 118 disposed between adjacent electrodes. The bottom electrode 112 is deposited on the top surface $S_{120}$ of the semiconductor substrate 120. In one or more embodiments, the electrodes 112, 114, and 116 comprise titanium nitride (TiN). Alternatively, the electrodes 112, 114, and 116 may optionally include tantalum nitride (TaN), tungsten nitride (WN), ruthenium (Ru), iridium (Ir), platinum (Pt), and combinations thereof. Additionally, each electrode may include a stack of two or more layers, such as a stack of titanium nitride and titanium layers or a stack of titanium nitride and tungsten layers. Although not limited by the present disclosure, each electrode may have a thickness ranging from about 10 nm to about 80 nm, such as about 40 nm. Capacitance is formed between the bottom electrode 112 and the middle electrode 114, as well as between the middle electrode 114 and the top electrode 116. The total capacitance provided by the MIM capacitor 110 is roughly the sum of capacitance formed between each pair of adjacent electrodes. To increase the total capacitance, in some embodiments, the MIM capacitor 110 may have more than one middle electrode, such as two or three middle electrodes, to stack more capacitance. In yet another embodiment, the MIM capacitor 110 may include only the bottom electrode 112 and the top electrode 116. Consequently, a capacitance form between the top and bottom electrodes is roughly the total capacitance provided by the MIM capacitor 110.

The insulating dielectric layer 118 is a high-k dielectric material such as zirconium oxide ($ZrO_2$). Alternatively, the insulating dielectric layer 118 may optionally include one or more layers of silicon oxide ($SiO_2$), silicon nitride ($Si_3N_4$), silicon oxynitride (SiON), aluminum oxide ($Al_2O_3$), hafnium silicates (HfSiON), tantalum oxide ($Ta_2O_5$), hafnium oxide ($HfO_2$), titanium oxide ($TiO_2$), barium strontium titanate (BST), strontium titanate oxide (STO), or combinations thereof. The insulating dielectric layer 118 between adjacent electrodes may have a thickness ranging from about 2 nm to about 18 nm, such as about 6 nm. In the illustrated embodiment, the insulating dielectric layer 118 is formed as a blanket layer over both the regions 102 and 104.

Figure 25:
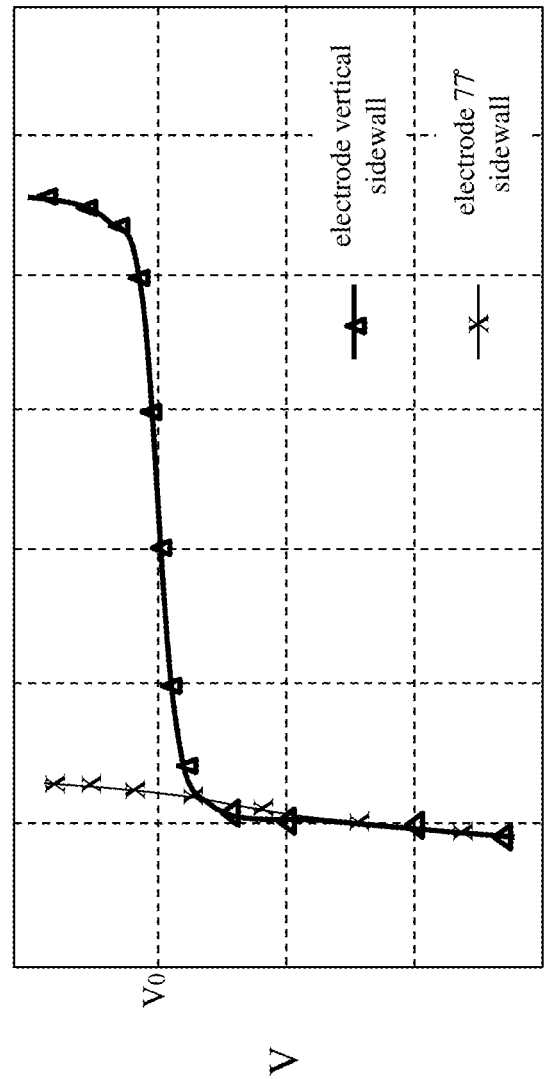
FIG. 25 illustrates breakdown voltage curve comparison between various MIM structures.

In the illustrated embodiment, the bottom electrode 112 has a sidewall $S_{112}$ at its corner region, which is slanted with respect to the top surface $S_{120}$ of the semiconductor substrate 120. The sidewall $S_{112}$ forms an angle between about 60 degrees and about 80 degrees with respect to the top surface $S_{120}$ (or with respect to a bottom surface of the bottom electrode 112), such as about 77 degrees. This sidewall $S_{112}$ is also referred to as a slanted sidewall or a tapered sidewall. The tapered sidewall $S_{112}$ facilitates the dielectric material of the insulating dielectric layer 118 to better land in the corner region. Compared with an otherwise vertical sidewall, the insulating dielectric layer 118 is denser over a tapered sidewall. As a result, leakage current, which is commonly found in a corner region of an MIM capacitor, is suppressed. On another hand, dielectric breakdown voltage (Vbd) of some MIM capacitors with a broader range of Vbd (referred to as "Vbd tailing") often causes a reliability issue. For example, an MIM capacitor with a strong leakage current often suffers such a Vbd tailing, which induces unstable or unwanted device performance. An exemplary Vbd tailing curve is illustrated in FIG. 25. As shown in FIG. 25, for electrodes with a vertical sidewall, when voltage across the electrodes is slightly larger than a threshold $V_0$, leakage current across the electrodes dramatically increases until the capacitor is entirely brokedown.

Also shown in FIG. 25, with a tapered sidewall of above 77 degrees with respect to the top surface $S_{120}$ (or equivalently 13 degrees tilted from a vertical direction), even voltage across the electrodes has been larger than the threshold $V_0$, there is still no observable Vbd tailing curve. Alleviated by a tapered sidewall $S_{112}$, the suppressed leakage current helps reducing the Vbd tailing problem of an MIM capacitor. Further, in some embodiments, the insulating dielectric layer deposited over a tapered sidewall is thicker compared with a vertical sidewall, which enlarges the separation between two adjacent electrodes in the corner region. Due to the larger separation, a breakdown is also less likely to happen. The inventors of the present disclosure have observed that when a tapered sidewall is tilted from a vertical direction for at least 10 degrees, the Vbd tailing will be noticeably mitigated, as illustrated in FIG. 25.

Referring back to FIG. 1, the middle electrode 114 may also have tapered sidewalls $S_{114}$ at its corners to improve device performance. The sidewall $S_{114}$ forms an angle between about 60 degrees and about 80 degrees with respect to the top surface $S_{120}$, such as about 77 degrees.

The top electrode 116 may optionally have a tapered sidewall as well or a vertical sidewall instead. In the illustrated embodiment, the top electrode 116 has a substantially vertical sidewall $S_{116}$ with respect to the top surface $S_{120}$ of the semiconductor substrate 120. Since the top electrode 116 is not covered by the insulating dielectric layer 118, few leakage current occurs in a corner region of the top electrode 116. Therefore, a vertical sidewall $S_{116}$ would not substantially deteriorate the device reliability, compared to sidewalls of the middle and bottom electrodes. In some embodiments, in regard of forming tapered sidewalls in the middle and bottom electrodes and a vertical sidewall in the top electrode during etching processes, middle and bottom electrodes may have the same conductive material composition, but different from the conductive material composition in the top electrode.

Still referring to FIG. 1, the semiconductor device 100 has one or more material layers covering the MIM capacitor 110, such as an upper dielectric layer 150, a passivation layer 152, and a protective layer 154. The upper dielectric layer 150 may comprise plasma-enhanced oxide (PEOX), plasma-enhanced SiN (PE-SiN), undoped silicate glass (USG), plasma-enhanced USG (PE-USG), or the like. The upper dielectric layer 150 may be formed by PECVD, FCVD, or other suitable methods. In some embodiments, the upper dielectric layer 150 has a thickness ranging from about 200 nm to about 1000 nm, such as about 450 nm. The passivation layer 152 may comprise plasma-enhanced oxide (PEOX), plasma-enhanced USG (PE-USG), or the like. The passivation layer 152 may be formed by PECVD, FCVD, or other suitable methods. In some embodiments, the passivation layer 152 has a thickness ranging from about 600 nm to about 3000 nm, such as about 1200 nm. The protective layer 154 may comprise silicon nitride, silicon oxynitride, or the like. The protective layer 154 may be formed by LPCVD, PECVD, or other suitable methods. In some embodiments, the protective layer 154 has a thickness ranging from about 300 nm to about 1000 nm, such as about 700 nm.

The semiconductor device 100 further includes a plurality of contacts 160 (or vias 160) extending through the upper dielectric layer 150 and the dielectric layer 140, and engage respective conductive features 134. Specifically, in the region 104, the contact 160a further extends through the top and bottom electrodes 116 and 112 and the insulating dielectric layer 118 therebetween. The contact 160a electrically couples the top and bottom electrodes 112 and 116 to the conductive features 134a. The contact 160b extends through the middle electrode 114 and the insulating dielectric layer 118 sandwiching the middle electrode 114. The contact 160b electrically couples the middle electrode 118 to the conductive feature 134b. When there are different voltage levels applied to the conductive features 134a and 134b, voltage difference is also built up between the top/bottom electrodes and the middle electrode of the MIM capacitor 110 coupled from the respective contacts, and charges start to accumulate in the MIM capacitor 110. In the region 102, the contact 160c extends through the insulating dielectric layer 118 and engages the conductive feature 134c. The contact 160c routes the signals in the conductive feature 134c to a top level or external of the device. The contacts 160 have top portions (such as conductive lines or conductive pads) above the upper dielectric layer 150. Bonding wires from external of the device 100 may land on the top portions of the contacts 160 through openings 170 thereabove. Although only contacts 160a/160b and contact 160c are depicted in regions 104 and 102, respectively, it is understood that a plurality of similar contacts may electrically couple to various features in both regions.

The contacts 160 may comprise tungsten, copper, aluminum, other suitable conductive material, or combinations thereof. The contacts 160 may be formed by suitable photolithography, etching, and deposition processes, such as chemical vapor deposition (CVD) or physical vapor deposition (PVD). In yet one embodiment, the formation of the contacts 160 may include a single damascene process or a dual damascene process. In one or more embodiments, the contacts 160 have a circular-shaped cross-section; however, they may alternatively have any suitably-shaped cross-section such as a square or rectangular-shaped cross-section. In one embodiment, the contacts 160 further include a liner layer 164. The liner layer 164 may include TaN, TiN, HfN, ZrN, WN, NbN, MoN, combinations thereof, and/or other suitable conductive material. The liner layer 164 may be formed by chemical vapor deposition (CVD), atomic layer deposition (ALD), physical vapor deposition (PVD), plating, and/or other suitable deposition processes.

The contact 160 (e.g., contact 160a) has a sidewall $S_{160}$ that can be divided into three portions, namely, an upper sidewall $S_{160-1}$, a middle sidewall $S_{160-2}$, and a lower sidewall $S_{160-3}$. The upper sidewall $S_{160-1}$ forms an angle between about 70 degrees and about 90 degrees with respect to the top surface $S_{120}$ of the semiconductor substrate 120 (or with respect to a bottom surface of the bottom electrode 112), such as about 80 degrees. The middle sidewall $S_{160-2}$ forms an angle between about 30 degrees and about 70 degrees with respect to the top surface $S_{120}$ of the semiconductor substrate 120 (or with respect to a bottom surface of the bottom electrode 112), such as about 50 degrees. Therefore, the middle sidewall $S_{160-2}$ is referred to as a tapered sidewall with respect to the top sidewall $S_{160-1}$. The lower sidewall $S_{160-3}$ forms an angle between about 70 degrees and about 90 degrees with respect to the top surface $S_{120}$ of the semiconductor substrate 120 (or with respect to a bottom surface of the bottom electrode 112), such as about 80 degrees. In some embodiments, the lower sidewall $S_{160-3}$ is substantially parallel to the top sidewall $S_{160-1}$. In some embodiments, the middle sidewall $S_{160-2}$ is tapered in a way such that imaginary lines extended along sidewalls $S_{160-2}$ will intersect at a vertex $V_{160-2}$, which is above a bottom surface of the contact 160.

In contact 160a, the middle sidewall $S_{160-2}$ has physical contact with the top electrode 116, the insulating dielectric layer 118, and the bottom electrode 112. By tapering the middle sidewall $S_{160-2}$, the contact area between the electrodes and the contact 160a is enlarged, which reduces contact resistance. Consequently, a capacitive frequency response of the MIM capacitor 110 is improved in a less resistive environment. Similarly, in contact 160b, the middle sidewall $S_{160-2}$ has physical contact with the middle electrode 114 and the insulating dielectric layer 118. By tapering the middle sidewall $S_{160-2}$, the contact area between the middle electrode 114 and the contact 160a is enlarged, which further reduces contact resistance and helps improving capacitive frequency response of the MIM capacitor 110 as well.

Figure 2:
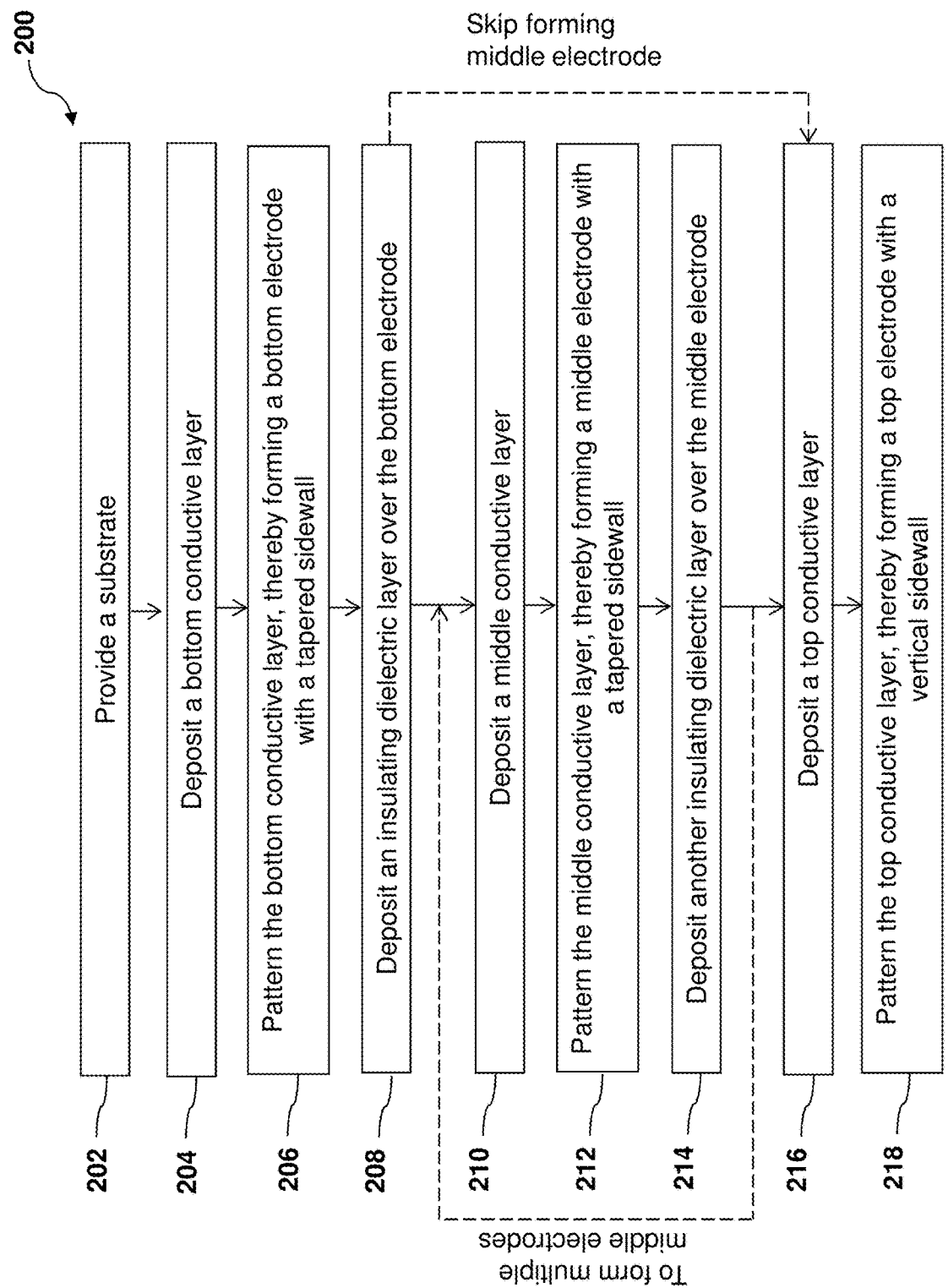
FIG. 2 illustrates a flow chart of a method for forming an MIM structure, according to aspects of the present disclosure.

FIG. 2 illustrates a flow chart of a method 200 for forming an MIM structure in accordance with an embodiment. The method 200 is merely an example, and is not intended to limit the present disclosure beyond what is explicitly recited in the claims. Additional operations can be provided before, during, and after the method 200, and some operations described can be replaced, eliminated, or moved around for additional embodiments of the method. The method 200 is described below in conjunction with FIGS. 3-12, which illustrate various cross-sectional views of a semiconductor device 300 during fabrication steps according to the method 200.

Figure 3:
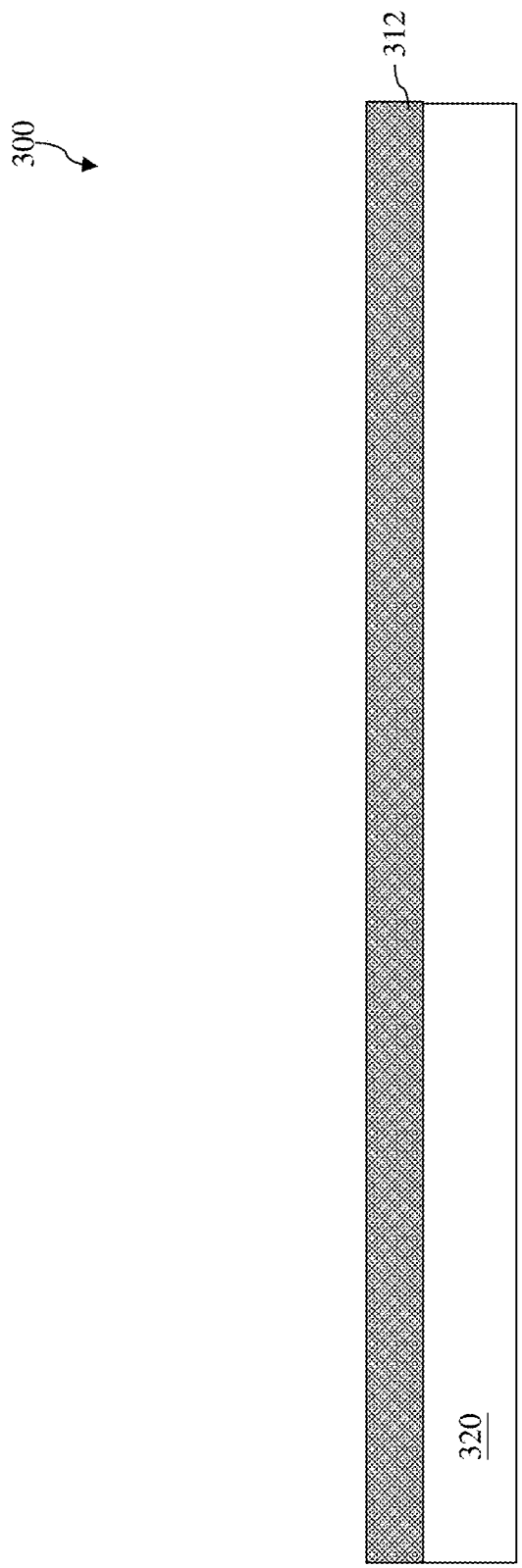
FIGS. 3, 4, 5, 6, 7, 8, 9, 10, 11, 12 illustrate sectional side views of an MIM structure during a fabrication process according to the method of FIG. 2, in accordance with some embodiments.

At operation 202, the method 200 (FIG. 2) provides, or is provided with, a device structure 300 having a substrate 320, such as shown in FIG. 3. The various material compositions and layers of the substrate 320 are similar to what have been discussed above with reference to the substrate 120 in FIG. 1. In various embodiments, the substrate 320 is a wafer, such as a silicon wafer, and may include one or more metallization layers in its upper portion.

At operation 204, the method 200 (FIG. 2) deposits a bottom conductive layer 312 on the substrate 320, such as shown in FIG. 3. The various material compositions of the bottom conductive layer 312 are similar to what have been discussed above with reference to the bottom electrode 112 in FIG. 1. In one embodiment, the bottom conductive layer 312 is a layer of TiN deposited to a thickness ranging from about 10 nm to about 80 nm, such as about 40 nm, but in other embodiments may be thicker or thinner. It may be formed by atomic layer deposition (ALD), PVD, CVD, or other suitable technique.

Figure 4:
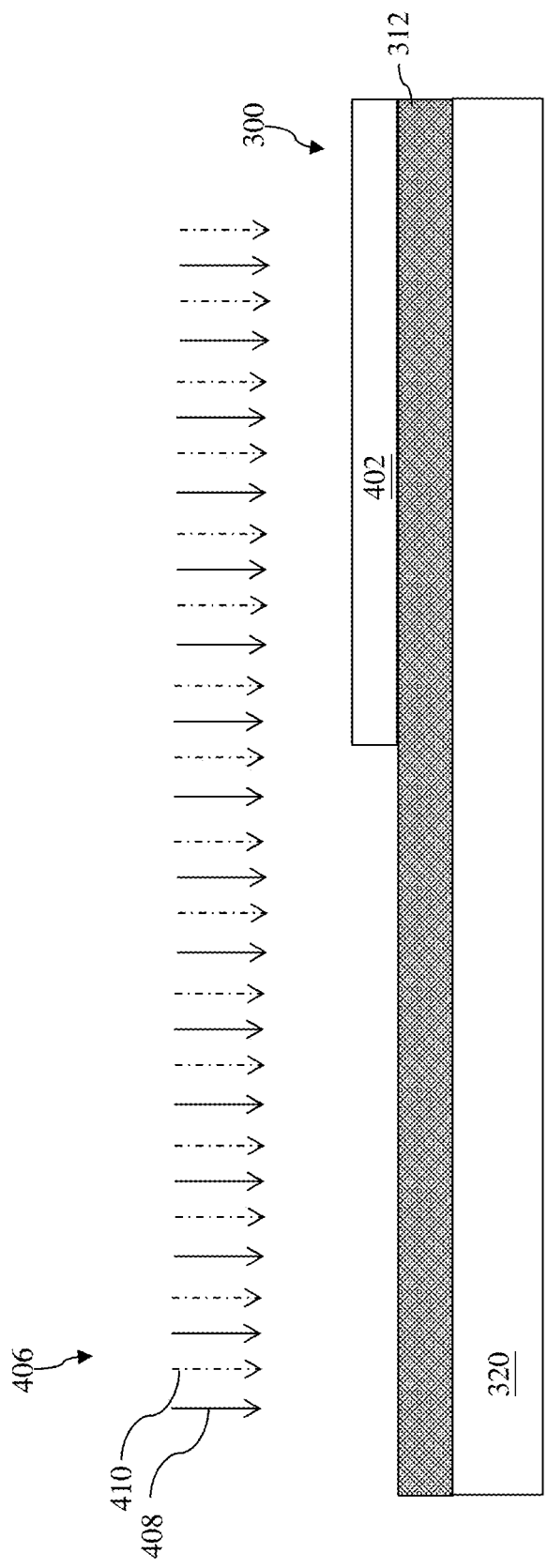

At operation 206, the method 200 (FIG. 2) patterns the bottom conductive layer 312, thereby forming a bottom electrode 312'. Referring to FIG. 4, operation 206 includes forming a patterned hard mask layer 402 above the bottom conductive layer 312 and transferring a pattern in the hard mask layer 402 to the bottom conductive layer 312.

Materials suitable for the hard mask layer 402 include, but not limited to, silicon oxide, silicon nitride, poly-silicon, $Si_3N_4$, SiON, TEOS, nitrogen-containing oxide, nitride oxide, high K material (K>5), or combinations thereof. The hard mask layer 402 is formed by a procedure that includes deposition. For example, a hard mask layer 402 of silicon oxide is formed by thermal oxidation. Alternatively, a hard mask layer 402 of silicon nitride (SiN) is formed by chemical vapor deposition (CVD). For example, the SiN layer is formed by CVD using chemicals including Hexachlorodisilane (HCD or $Si_2Cl_6$), Dichlorosilane (DCS or $SiH_2Cl_2$), Bis (TertiaryButylAmino) Silane (BTBAS or $C_8H_{22}N_2Si$) and Disilane (DS or $Si_2H_6$). In an embodiment, the hard mask layer 402 is about 20 nm to about 200 nm thick.

Patterning the hard mask layer 402 includes a lithography process and an etching process. In the present embodiment, a photoresist layer is formed on the hard mask layer 402 using a spin-coating process and soft baking process. Then, the photoresist layer is exposed to a radiation. The exposed photoresist layer is developed using post-exposure baking (PEB), developing, and hard baking thereby forming a patterned photoresist layer over the hard mask layer 402. Subsequently, the hard mask layer 402 is etched through the openings of the patterned photoresist layer, forming a patterned hard mask layer 402. The patterned photoresist layer is removed thereafter using a suitable process, such as wet stripping or plasma ashing. In one example, the etching process includes applying a dry (or plasma) etch to remove the hard mask layer 402 within the openings of the patterned photoresist layer. In another example, the etching process includes applying a wet etch with a hydrofluoric acid (HF) solution to remove the hard mask layer 402 within the openings.

Subsequently, operation 206 etches the bottom electrode layer 312 in a dry etching process, using the patterned hard mask layer 402 as an etch mask. In the illustrated embodiment, the dry etching is a plasma etching including process parameters such as reactor operating pressure ranging from about 10 mTorr to about 300 mTorr, an RF power less than 2700 W (e.g., ranging from about 900 W to about 1600 W), a bias voltage less than about 4500 W, a temperature ranging from about 10 degrees Celsius to about 80 degrees Celsius, and a plasma etching period ranging from about 200 seconds to about 500 seconds. The plasma source gas 406 includes an ion composition 408 suitable for physical bombardment, such as argon (Ar), a fluorine-containing gas (e.g., $CF_4$, $SF_6$, $CH_2F_2$, $CHF_3$, $C_4F_8$, $C_2F_6$), or a combination thereof. In a specific embodiment, the ion composition 408 includes a fluorine-containing gas for a high directional physical bombardment of the bottom electrode layer 312 exposed through the patterned hard mask layer 402. High directional physical bombardment alone will form bottom electrode 312' with a sharp vertical sidewall. The inventors have observed that by adding certain chemical etchant 410 with sufficiently high gas flow rate to the plasma gas will slow down the etch rate and result in a tapered sidewall. In some embodiments, the chemical etchant 410 is a chlorine-containing gas (e.g., $Cl_2$, $CHCl_3$, $CCl_4$) for chemical etching. In some embodiments, the chemical etchant 410 comprises boron (B) (e.g., $B_2F_4$, $BCl_3$, $B_4Cl_4$, $BBr_3$). The existence of Boron in the chemical etchant 410 slows down the etch rate. In a specific embodiment, the chemical etchant 410 comprises a combination of boron and chlorine. By adding the chemical etchant 410 to the plasma source gas, the plasma etching exhibits both physical etching and chemical etching capabilities. The sidewall tapering can be adjusted by tuning percentage of the chemical etchant 410 in the total etchant flow. In some embodiments, the total etchant flow rate is less than 1800 sccm, such as about 1200 sccm. The chemical etchant 410 may have a flow rate about 30% to about 50% of the total etchant flow rate, such as about 40%. The etching of the hard mask layer 402 and the bottom electrode layer 312 may be in-situ.

Figure 5:
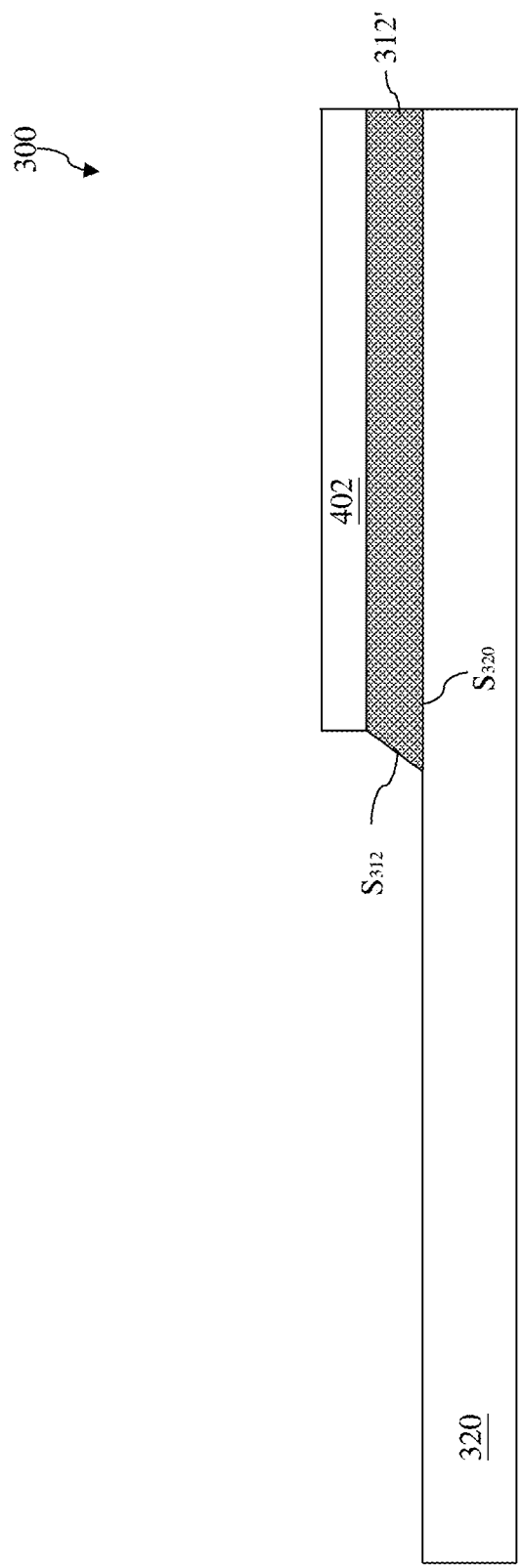

Referring to FIG. 5, the bottom electrode 312' has a tapered sidewall $S_{312}$. The sidewall $S_{312}$ forms an angle between about 60 degrees and about 80 degrees with respect to the top surface $S_{320}$ of the substrate 320 (or with respect to a bottom surface of the bottom electrode 312'), such as about 77 degrees. After forming the bottom electrode 312', the hard mask layer 402 is removed by a selective etching process.

Figure 6:
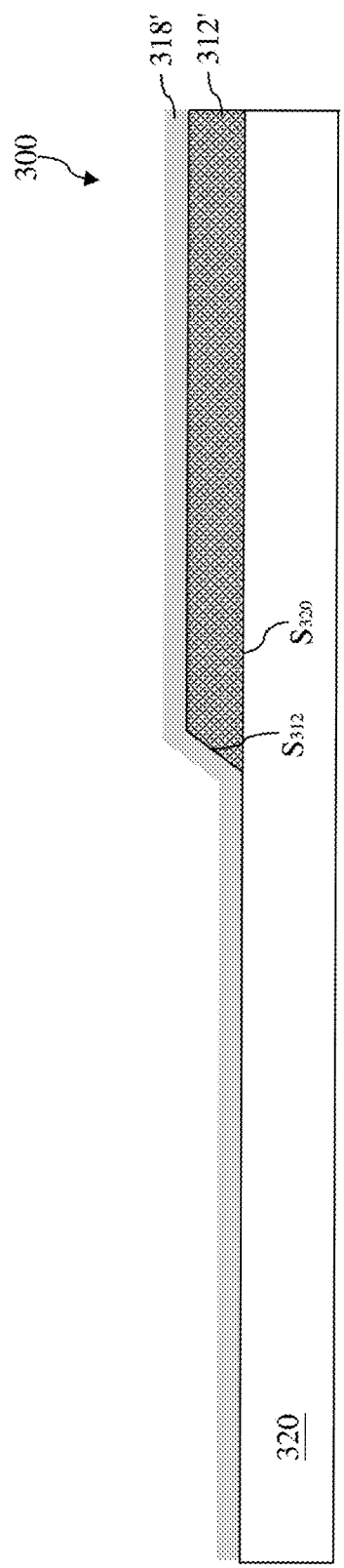

At operation 208, the method 200 (FIG. 2) deposits an insulating dielectric layer 318' over the bottom electrode 312', such as shown in FIG. 6. The various material compositions of the insulating dielectric layer 318' are similar to what have been discussed above with reference to the insulating dielectric layer 118 in FIG. 1. The insulating dielectric layer 318' is deposited conformally covering the semiconductor substrate 320 and the bottom electrode 312' as a blanket layer. A variety of suitable processes including chemical vapor depositions (CVD), low-pressure CVD (LPCVD), plasma-enhanced CVD (PECVD), and atomic layer deposition (ALD) may be used to form the insulating dielectric layer 318'. Due to the tapered sidewall $S_{312}$, material composition of the insulating dielectric layer 318' is easier to land and becomes denser and thicker in the corner region of the bottom electrode 312', which helps mitigating Vbd tailing of the MIM structure and enhancing device reliability. The insulating dielectric layer 318' may have a thickness ranging from about 2 nm to about 18 nm, such as about 6 nm.

Figure 7:
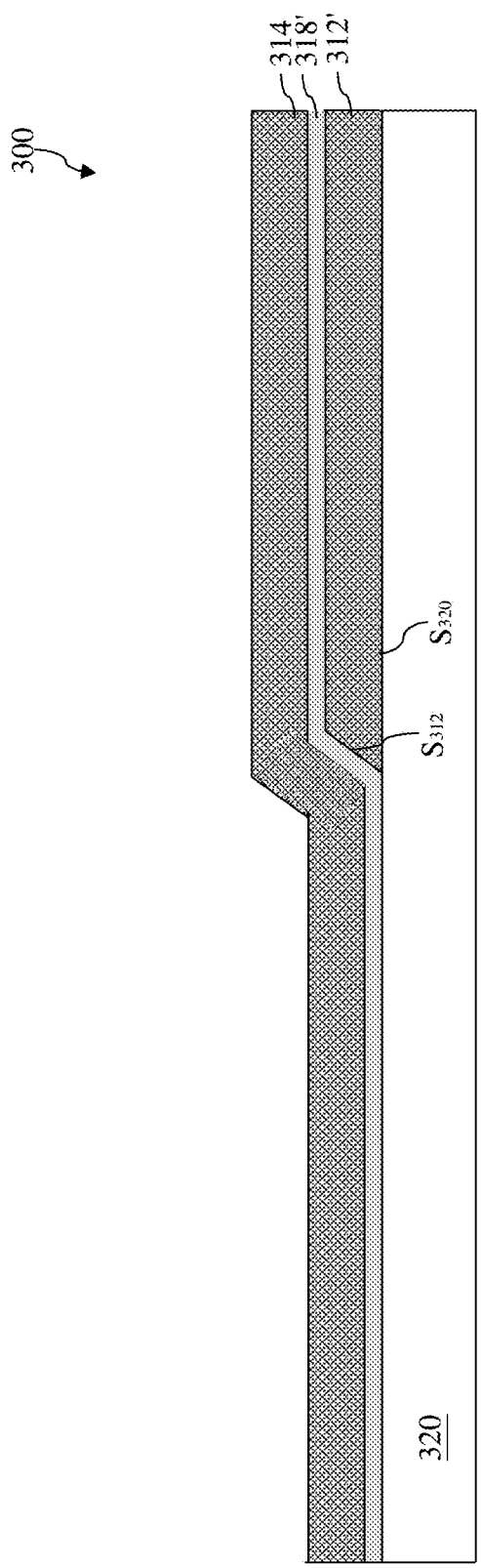

At operation 210, the method 200 (FIG. 2) deposits a middle conductive layer 314 on the insulating dielectric layer 318', such as shown in FIG. 7. The various material compositions of the middle conductive layer 314 are similar to what have been discussed above with reference to the middle electrode 114 in FIG. 1. In one embodiment, the bottom and middle conductive layers 312 and 314 have the same material composition. In one embodiment, the middle conductive layer 314 is a layer of TiN deposited to a thickness ranging from about 10 nm to about 80 nm, such as about 40 nm, but in other embodiments may be thicker or thinner. It may be formed by atomic layer deposition (ALD), PVD, CVD, or other suitable technique.

Figure 8:
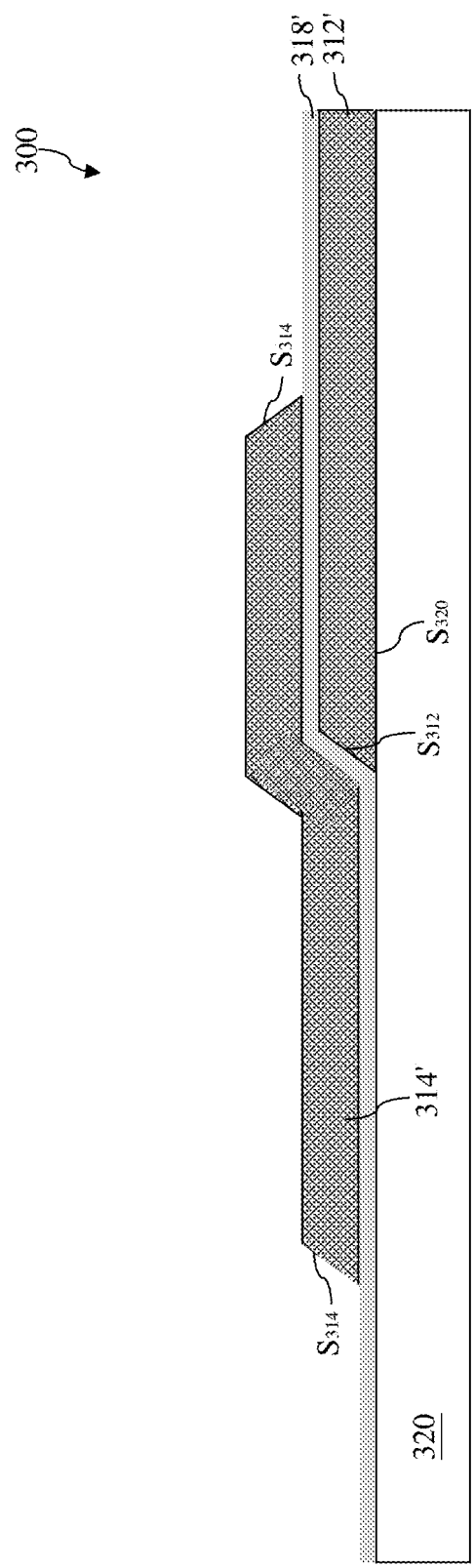

At operation 212, the method 200 (FIG. 2) patterns the middle conductive layer 314, resulting in a middle electrode 314', such as shown in FIG. 8. Operation 212 includes similar procedures as in operation 206. Operation 212 first forms a patterned hard mask layer (not shown) on the middle conductive layer 314. Operation 212 then applies a plasma source gas 406 (as shown in FIG. 4) comprising an ion composition 408 suitable for physical bombardment and a chemical etchant 410 suitable for chemical etching. A pattern in the hard mask layer is thus transferred to the middle conductive layer 314, resulting in the middle electrode 314' with tapered sidewalls $S_{314}$.

Figure 9:
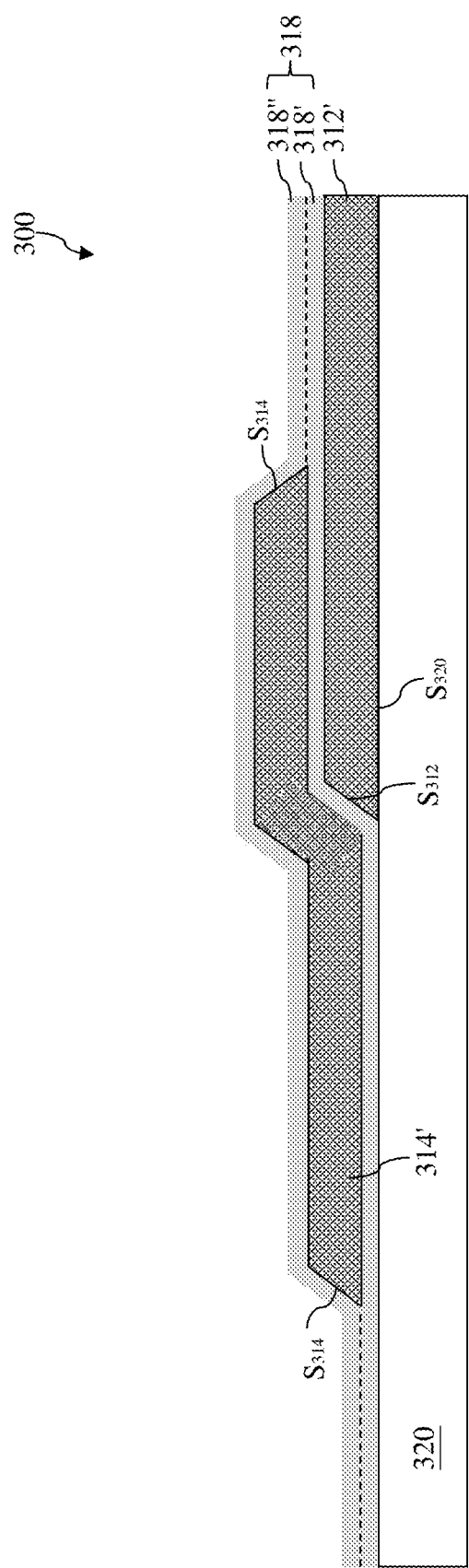

At operation 214, the method 200 (FIG. 2) deposits another insulating dielectric layer 318" over the middle electrode 314', such as shown in FIG. 9. In some embodiments, the insulating dielectric layer 318" has the same material composition with the insulating dielectric layer 318'. In some alternative embodiments, the insulating dielectric layer 318" has different material composition with the insulating dielectric layer 318', such as to tune different capacitance density between different pairs of electrodes. In a specific embodiment, the insulating dielectric layers 318' and 318" both comprise hafnium oxide ($HfO_2$). In another embodiment, the insulating dielectric layer 318' comprises hafnium oxide ($HfO_2$) and the insulating dielectric layer 318" comprises aluminum oxide ($Al_2O_3$). The insulating dielectric layer 318" is deposited conformally covering the insulating dielectric layer 318' and the middle electrode 314' as a blanket layer. A variety of suitable processes including chemical vapor depositions (CVD), low-pressure CVD (LPCVD), plasma-enhanced CVD (PECVD), and atomic layer deposition (ALD) may be used to form the insulating dielectric layer 318". Due to the tapered sidewall $S_{314}$, material composition of the insulating dielectric layer 318" is easier to land and becomes denser in the corner region of the middle electrode 314', which helps improving Vbd tailing of the MIM structure and enhancing device reliability. The insulating dielectric layer 318" may have a thickness ranging from about 2 nm to about 18 nm, such as about 6 nm. The insulating dielectric layers 318' and 318" are collectively denoted as the insulating dielectric layer 318.

To achieve higher total capacitance in the MIM structure, the method 200 (FIG. 2) may optionally repeat operations 210-214 one or more times to stack a plurality of middle electrodes before proceeding to operation 216.

Figure 10:
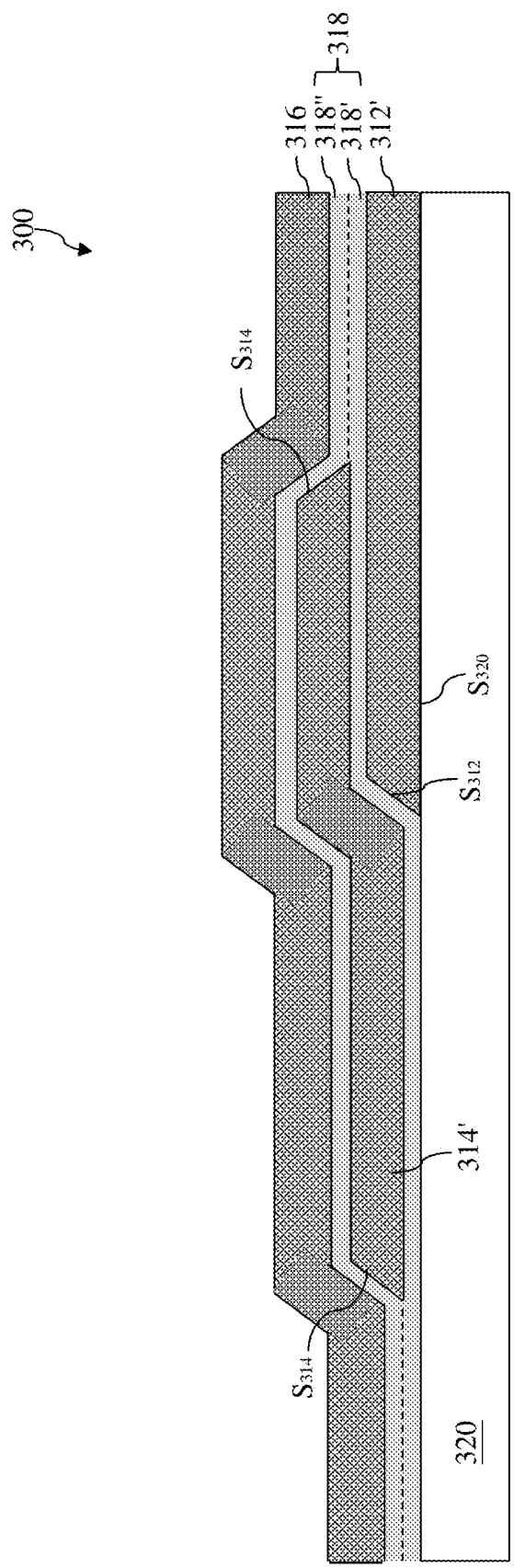

At operation 216, the method 200 (FIG. 2) deposits a top conductive layer 316 on the insulating dielectric layer 318", such as shown in FIG. 10. The various material compositions of the top conductive layer 316 are similar to what have been discussed above with reference to the top electrode 316 in FIG. 1. The conductive layers 312, 314, and 316 may have the same material composition. In one embodiment, the top conductive layer 316 is a layer of TiN deposited to a thickness ranging from about 10 nm to about 80 nm, such as about 40 nm, but in other embodiments may be thicker or thinner. It may be formed by atomic layer deposition (ALD), PVD, CVD, or other suitable technique. In an alternative embodiment, the bottom and middle conductive layers 312 and 314 have the same material composition, while the top conductive layer 316 has a different material composition.

Figure 11:
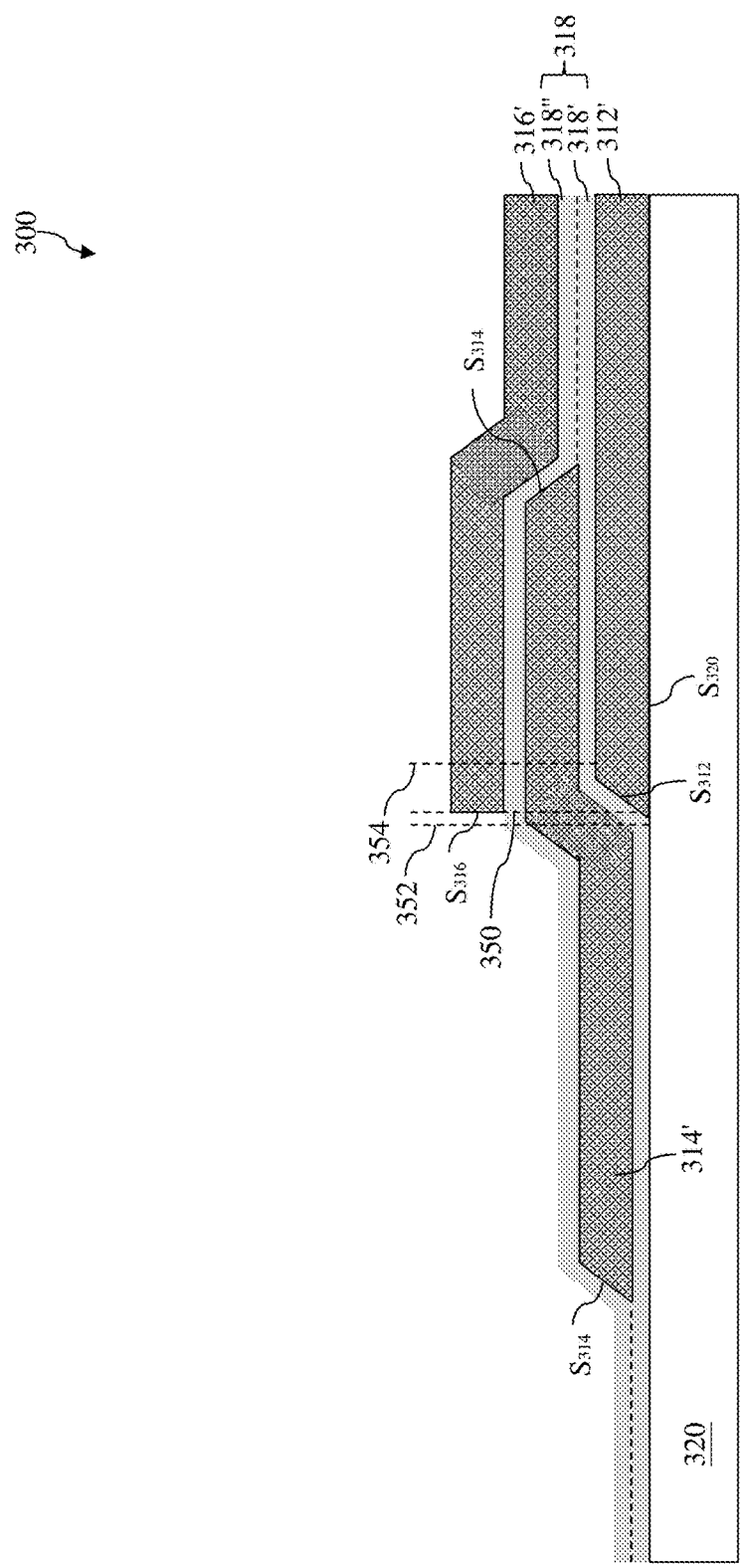

At operation 218, the method 200 (FIG. 2) patterns the top conductive layer 316, resulting in a top electrode 316', such as shown in FIG. 11. Operation 218 first forms a patterned hard mask layer (not shown) on the top conductive layer 316. Operation 218 then applies a plasma source gas 406 (as shown in FIG. 4) comprising an ion composition 408 suitable for physical bombardment but free of a chemical etchant 410. Alternatively, operation 218 may apply a plasma source gas 406 comprising an ion composition 408 suitable for physical bombardment and a chemical etchant 410 less than about 20% of the total gas flow rate, such as about 10%. The highly directional physical bombardment dominantly etches the top electrode 316' with a substantially vertical sidewall $S_{316}$. In various embodiments, the lateral position of the vertical sidewall $S_{316}$ varies. In one embodiment, the vertical sidewall $S_{316}$ is directly above the tapered sidewall $S_{312}$ of the bottom electrode 312' (e.g., along the dotted line 350). In another embodiment, the vertical sidewall $S_{316}$ is laterally offset from the bottom electrode 312' (e.g., along the dotted line 352). In yet another embodiment, the vertical sidewall $S_{316}$ is directly above a horizontal top surface of the bottom electrode 312' (e.g., along the dotted line 354).

Figure 12:
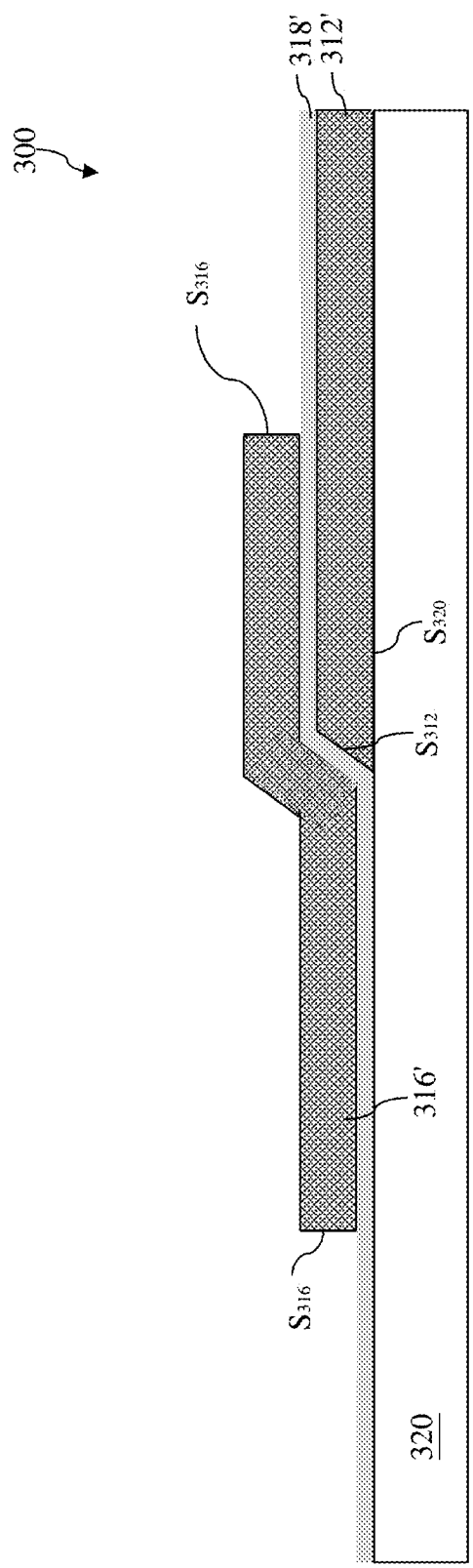

In some alternative embodiments, the method 200 (FIG. 2) may optionally skip operations 210-214 to proceed from operation 208 directly to operation 216, thereby forming the top electrode 316' above the bottom electrode 312' without any middle electrodes therebetween, such as shown in FIG. 12. The top electrode 316' and bottom electrode 312' will be electrically coupled to two separate contacts, such as the contacts 160b and 160a in FIG. 1, respectively.

Figure 13:
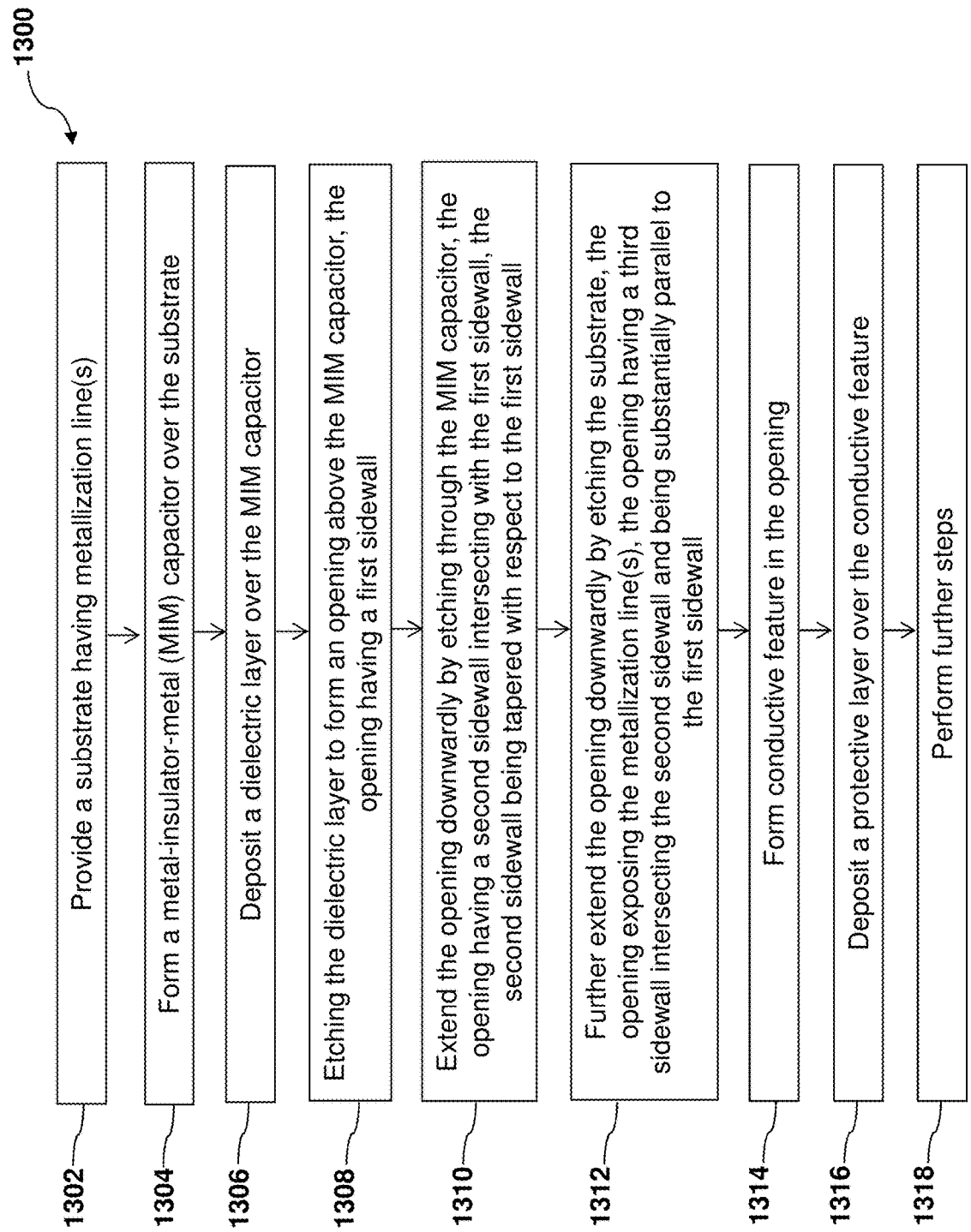
FIG. 13 illustrates a flow chart of a method for forming the semiconductor device shown in FIG. 1, according to aspects of the present disclosure.

FIG. 13 illustrates a flow chart of a method 1300 for forming the semiconductor device 100 in FIG. 1, in accordance with an embodiment. The method 1300 is merely an example, and is not intended to limit the present disclosure beyond what is explicitly recited in the claims. Additional operations can be provided before, during, and after the method 1300, and some operations described can be replaced, eliminated, or moved around for additional embodiments of the method. The method 1300 is described below in conjunction with FIGS. 14-24, which illustrate various cross-sectional views of the semiconductor device 100 during fabrication steps according to the method 1300.

Figure 14:
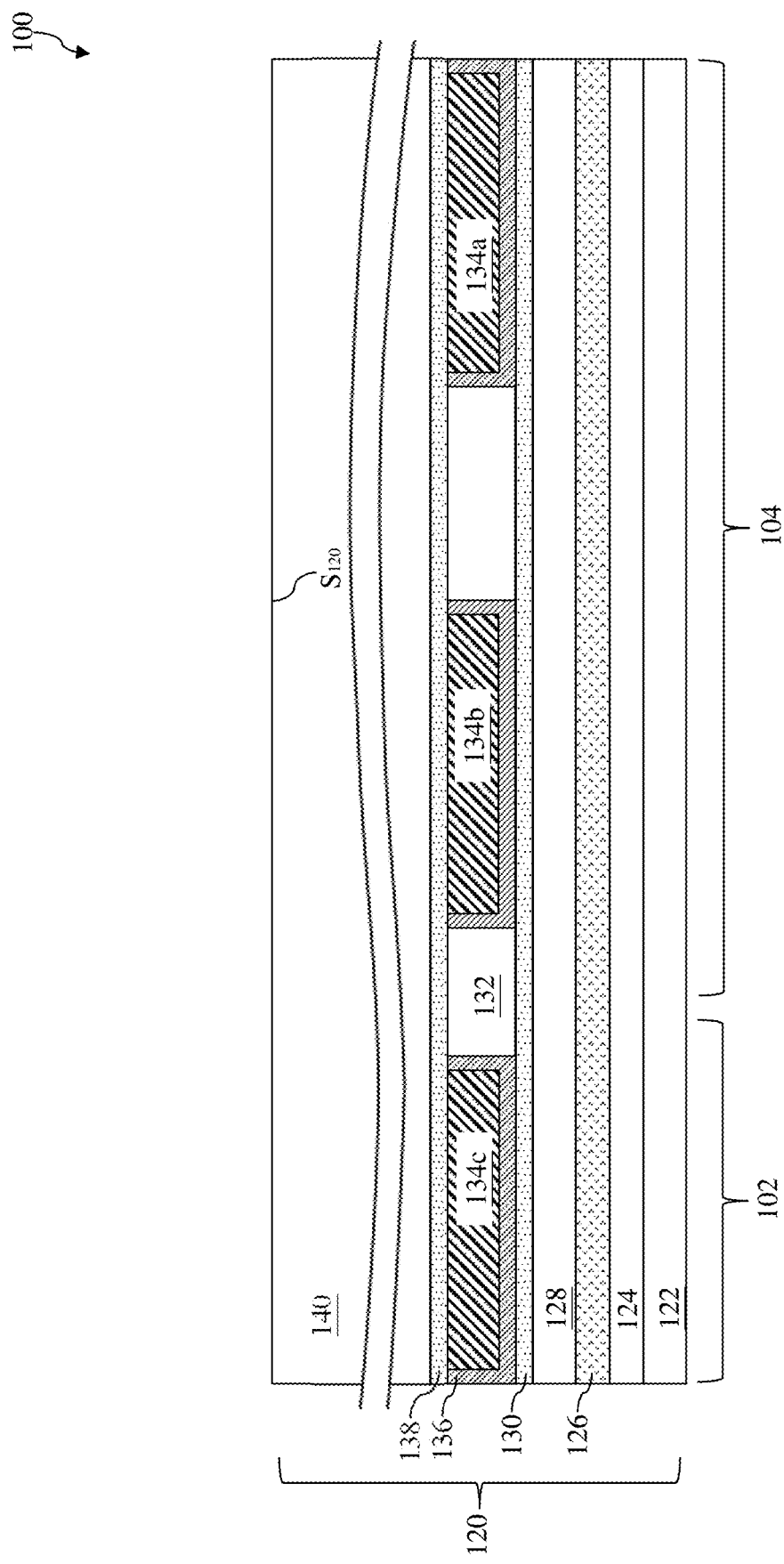

At operation 1302, the method 1300 (FIG. 13) provides, or is provided with, a semiconductor substrate 120, such as shown in FIG. 14. The various material compositions and layers of the semiconductor substrate 120 have been discussed above with reference to FIG. 1. Reference numerals are repeated for ease of understanding. In an embodiment, the semiconductor substrate 120 is a silicon substrate or alternatively another suitable semiconductor substrate. The semiconductor substrate 120 may include a plurality of features such as, field effect transistors (FETs) including gate, source and drain features; isolation features including those defining various active regions; interconnection or metallization layers (also referred to as a multi-layer interconnect structure) having metal lines, contacts, and vias/or interposed by inter-layer dielectric (ILD) layers and/or inter-metal dielectric (IMD) layers; capacitor structures; and/or other suitable devices and features. In an embodiment, the substrate provided in operation 1302 has been processed to the point that at least one metallization layer (e.g., M1, M2, M3, M4, M5, etc.) has been formed in a BEOL process, such as the illustrated conductive features 134a-c.

Figure 15:
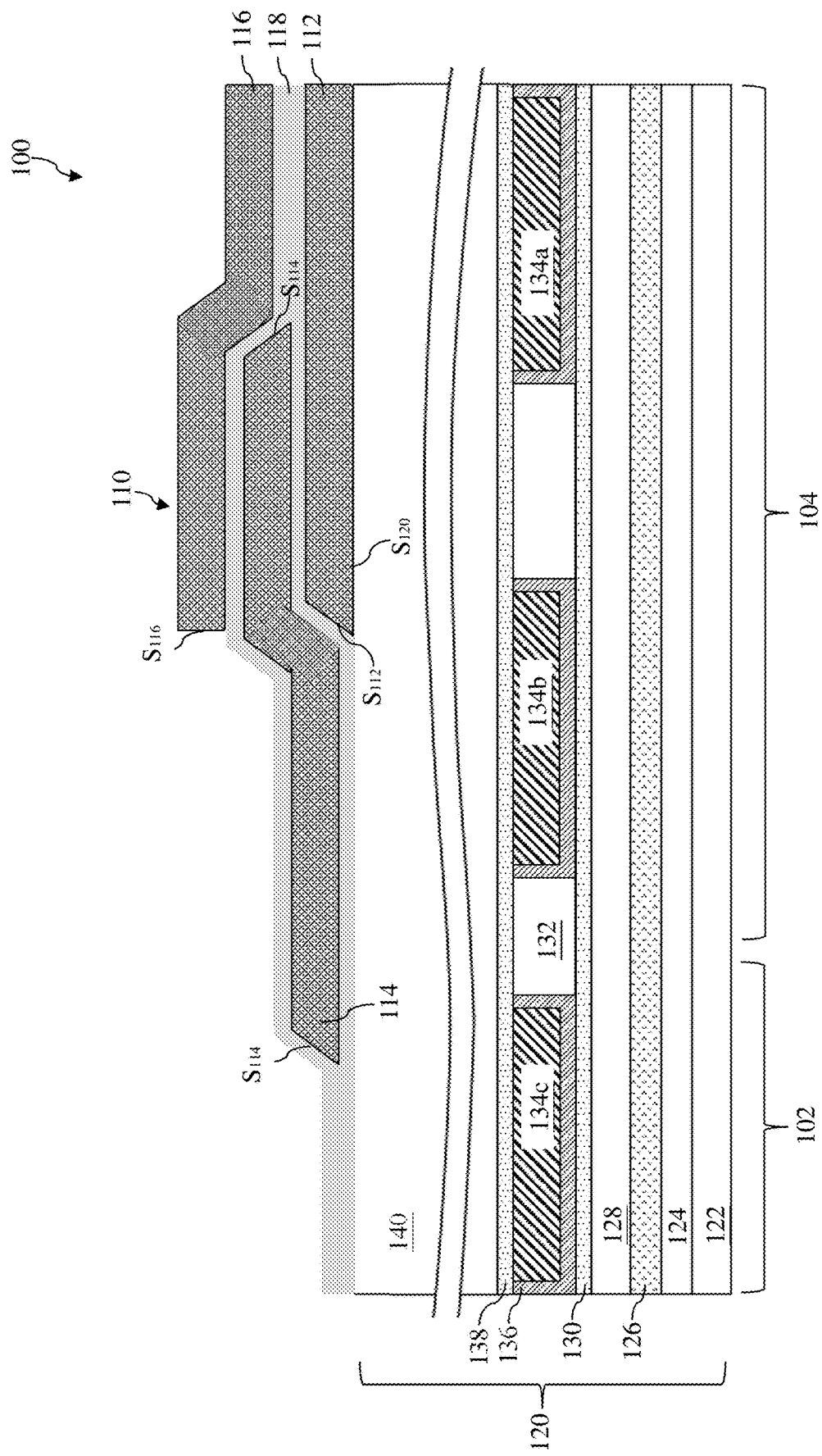

At operation 1304, the method 1300 (FIG. 13) form an MIM capacitor 110 over the semiconductor substrate 120, such as shown in FIG. 15. Operation 1304 may include operation 200 that has been discussed above with reference to FIG. 2. Electrodes 112, 114, and 116 and sub-layers of the insulating dielectric layer 118 are interleaved above the semiconductor substrate 120. In some embodiments, the MIM capacitor 110 has one or more middle electrodes 114. In some embodiments, the MIM capacitor 110 has no middle electrode 114, but top and bottom electrodes 112 and 116. For the electrodes covered by the insulating dielectric layer 118, such as the bottom electrode 112 and the middle electrode 114, sidewalls (e.g., $S_{112}$ and $S_{114}$) are tapered during an etching process to facilitate the landing of the insulating material. The top electrode 116 may remain a vertical sidewall $S_{116}$, through an etching process with a different etchant recipe.

Figure 16:
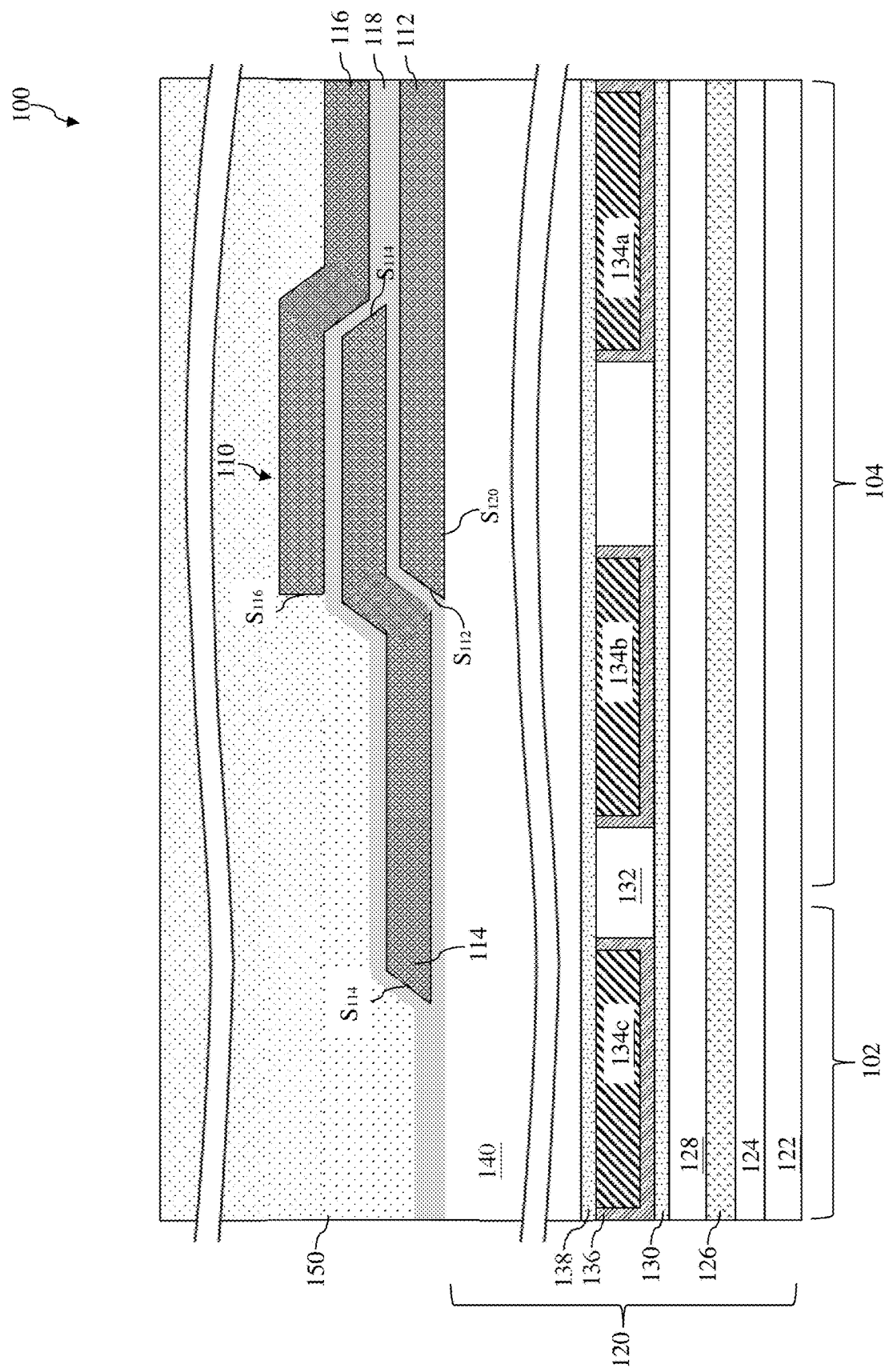

At operation 1306, the method 1300 (FIG. 13) deposits an upper dielectric layer 150 over the MIM capacitor 110, such as shown in FIG. 16. The upper dielectric layer 150 may comprise plasma-enhanced oxide (PEOX), plasma-enhanced SiN (PE-SiN), undoped silicate glass (USG), plasma-enhanced USG (PE-USG), or the like. The upper dielectric layer 150 may be formed by PECVD, FCVD, or other suitable methods.

Figure 17:
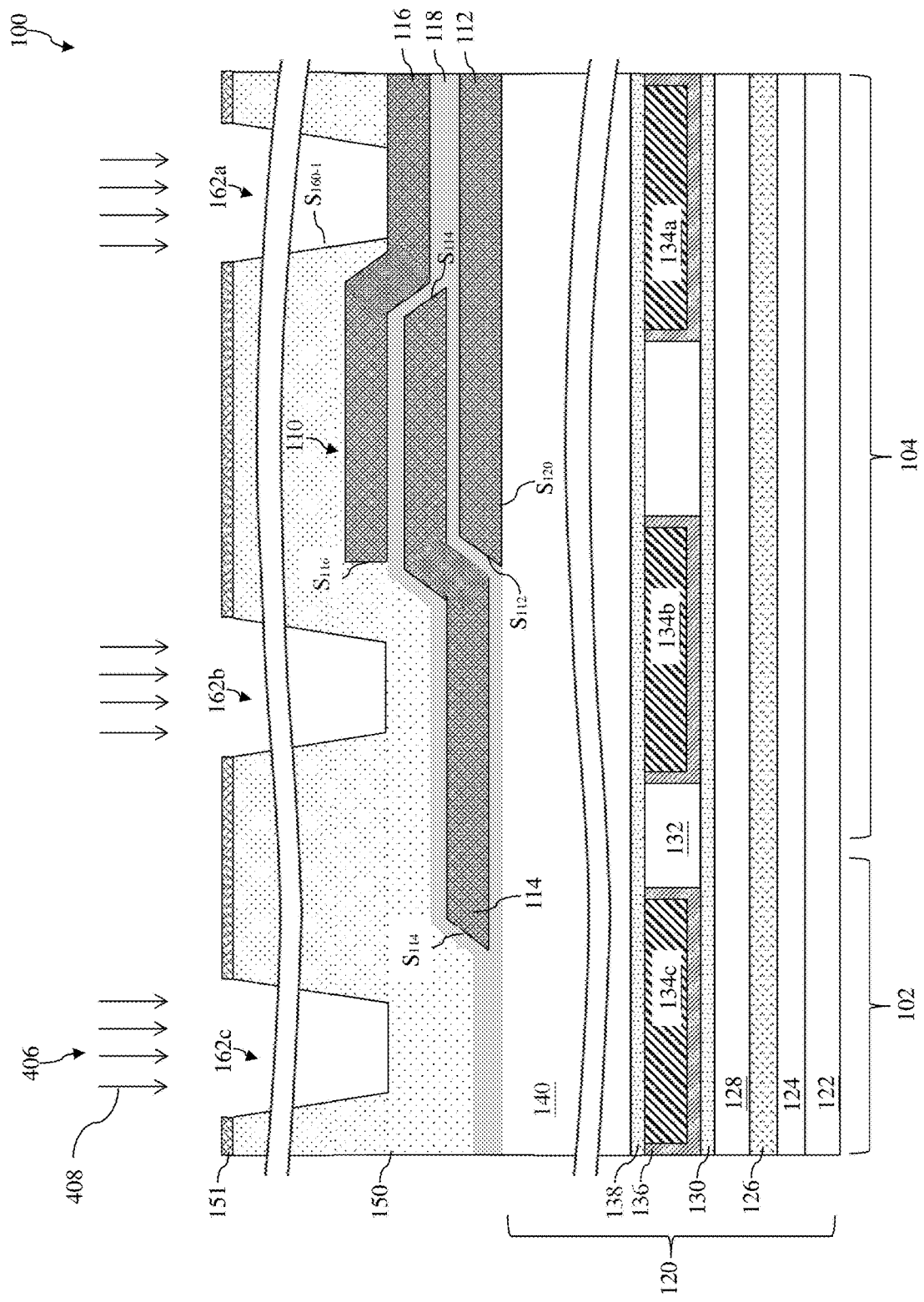

At operation 1308, the method 1300 (FIG. 13) etches the upper dielectric layer 150 to form openings 162 (e.g., openings 162a-c) in regions 102 and 104, such as shown in FIG. 17. In some embodiments, the upper portion of the openings 162 has a diameter ranging from about 2 um to about 30 um, such as about 2.7 um. Operation 1308 may first form a patterned hard mask layer 151 above the upper dielectric layer 150, and then etch through openings in the patterned hard mask layer 151. In some embodiments, the etching is a dry etching process, such as a plasma etching including a plasma reactor operating pressure ranging from about 10 mTorr to about 300 mTorr, an RF power less than 2700 W (e.g., ranging from about 900 W to about 1600 W), a bias voltage less than about 4500 W, a temperature ranging from about 10 degrees Celsius to about 80 degrees Celsius, and a plasma etching period ranging from about 200 seconds to about 500 seconds. The plasma source gas 406 includes an ion composition 408 suitable for physical bombardment, such as argon (Ar), a fluorine-containing gas (e.g., $CF_4$, $SF_6$, $CH_2F_2$, $CHF_3$, $C_4F_8$, $C_2F_6$), or a combination thereof. In a specific embodiment, the ion composition 408 includes a fluorine-containing gas for a high directional physical bombardment of the upper dielectric layer 150 exposed though the patterned hard mask layer 151. Alternatively, the plasma source gas 406 may also include certain chemical etchant 410 but with gas flow rate lower than 20% of the total etchant flow rate, such as about 10%. In some embodiments, the chemical etchant 410 is a chlorine-containing gas (e.g., $Cl_2$, $CHCl_3$, $CCl_4$) for chemical etching. In some embodiments, the chemical etchant 410 comprises boron (B) (e.g., $B_2F_4$, $BCl_3$, $B_4Cl_4$, $BBr_3$). In a specific embodiment, the chemical etchant 410 comprises a combination of boron and chlorine. With less than 20% of the total etchant flow rate for the chemical etchant 410, high directional physical bombardment is dominant during the etching process, therefore openings 162 are formed with an upper sidewall $S_{160-1}$ that is relatively sharp, such as about 70 degrees to about 90 degrees with respect to the top surface $S_{120}$ of the semiconductor substrate 120.

In some embodiments, the etching process may be monitored by an end-point control method to precisely control the etching time. An end-point control analyzes emitted residuals in real time during an etching process, such as by inspecting light spectra emitted by a plasma during the plasma etching with an optical emission spectroscopy (OES). When metallic material compositions from the top electrode 116 start being detected, the etching process stops at the upper surface of the top electrode 116. Accordingly, the upper sidewall $S_{160-1}$ has physical contact with the upper dielectric layer 150.

Figure 18:
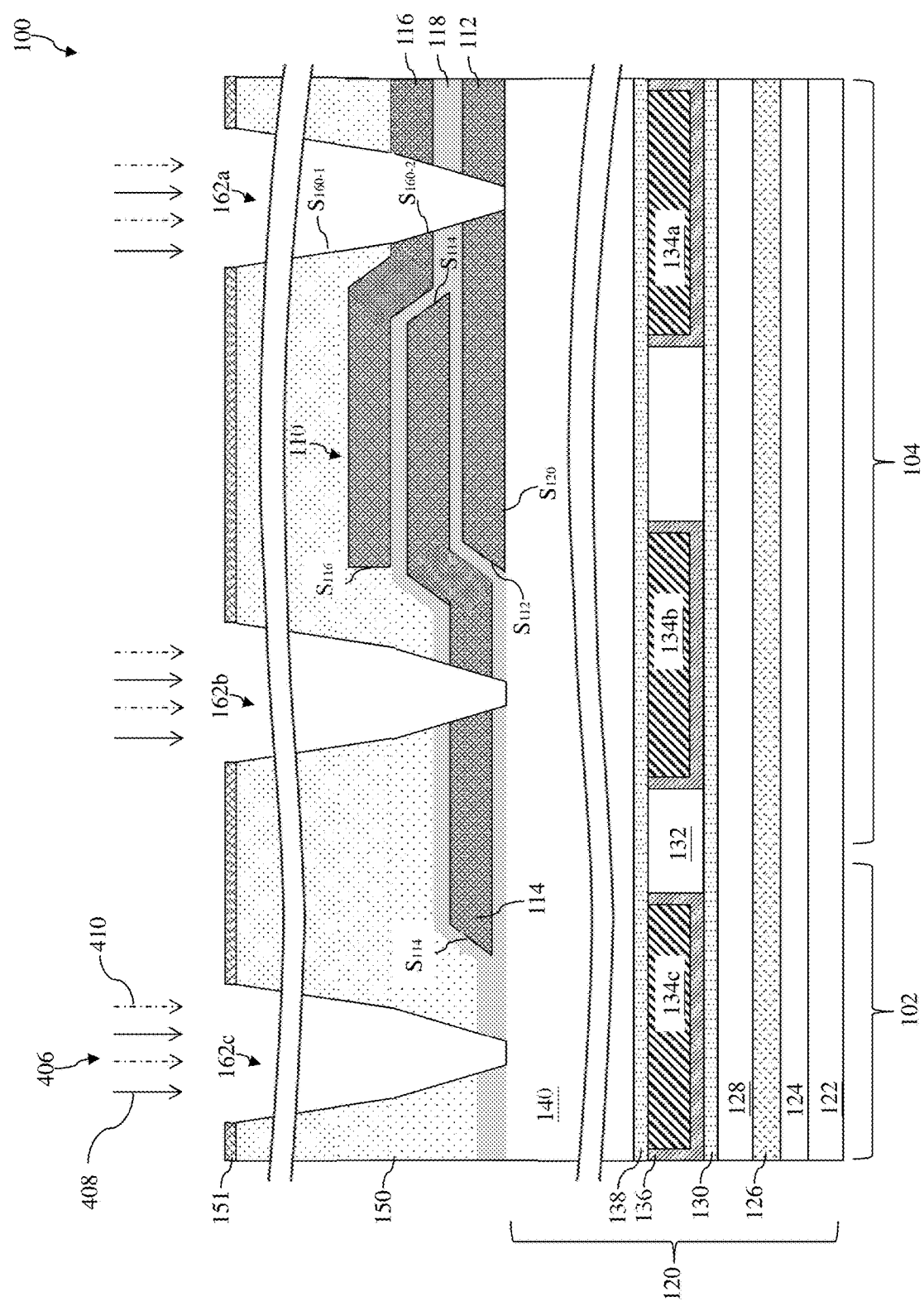

At operation 1310, the method 1300 (FIG. 13) extends the openings 162 downwardly through the MIM capacitor 110 by etching to form a middle sidewall $S_{160-2}$ that is tapered from the upper sidewall $S_{160-1}$, such as shown in FIG. 18. The operation 1310 is in-situ with operation 1308. Operation 1310 increases the chemical etchant 410 flow rate in the total etchant flow rate to above 30%, such as ranging from about 30% to about 40%. With combination of ion composition 408 suitable for physical bombardment and chemical etchant 410 suitable for chemical etching, the plasma source gas 406 exhibits both physical etching and chemical etching capabilities, which also slows down etching rate towards the MIM structure. As a result, middle sidewall $S_{160-2}$ has a moderate slope, forming a smaller angle with respect to the top surface $S_{120}$ compared to the upper sidewall $S_{160-1}$. The middle sidewall $S_{160-2}$ is also referred to as a tapered sidewall $S_{160-2}$. In various embodiments, the middle sidewall $S_{160-2}$ forms an angle between about 30 degrees and about 70 degrees with respect to the top surface $S_{120}$ of the semiconductor substrate 120 (or with respect to a bottom surface of the bottom electrode 112), such as about 50 degrees.

Figure 19:
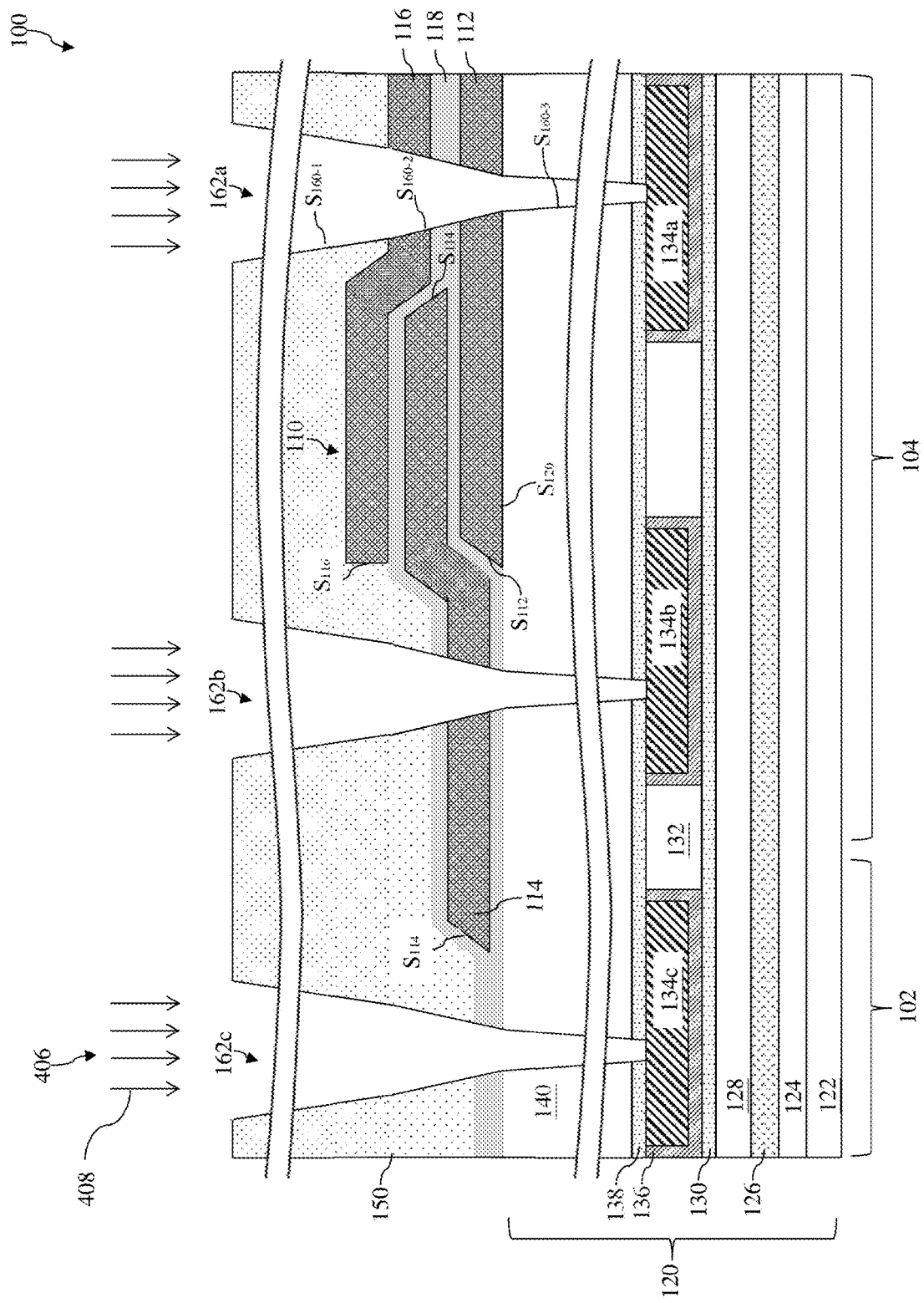

At operation 1312, the method 1300 (FIG. 13) further extends the openings 162 downwardly to expose the conductive features 134 by etching to form a lower sidewall $S_{160-3}$ that is shaper than the middle sidewall $S_{160-2}$, such as shown in FIG. 19. Operation 1312 is in-situ with operations 1308 and 1310. Operation 1312 reduces the chemical etchant 410 flow rate in the total gas flow rate to below about 20%, such as about 10%. Alternatively, operation 1312 may shut off the gaseous supply of the chemical etchant 410. The high directional physical bombardment becomes dominant again during the etching process, and the lower sidewall $S_{160-3}$ becomes relatively sharper compared to the middle sidewall $S_{160-2}$, such as about 70 degrees to about 90 degrees with respect to the top surface $S_{120}$ of the semiconductor substrate 120. In some embodiments, the lower sidewall $S_{160-3}$ is substantially parallel to the upper sidewall $S_{160-1}$. The lower sidewall $S_{160-3}$ has physical contact with the dielectric layer 140 and the etch stop layer 138.

Operation 1312 may include a two-step etching process. In the first step, layer 138 functions as an etch stop layer. The openings 162 extend downwardly to the top surface of the layer 138 and stop thereof. In the second step, a different etchant that has certain etch rate towards the layer 138 is applied to open up the layer 138 and allows the openings 162 to extend downwardly to the top surface of the conductive features 134. In some embodiments, a bottom portion of the opening 162 has a diameter ranging from about 0.5 um to about 5 um, such as 2 um. The hard mask layer 151 is subsequently removed by a selective etching process.

Figure 20:
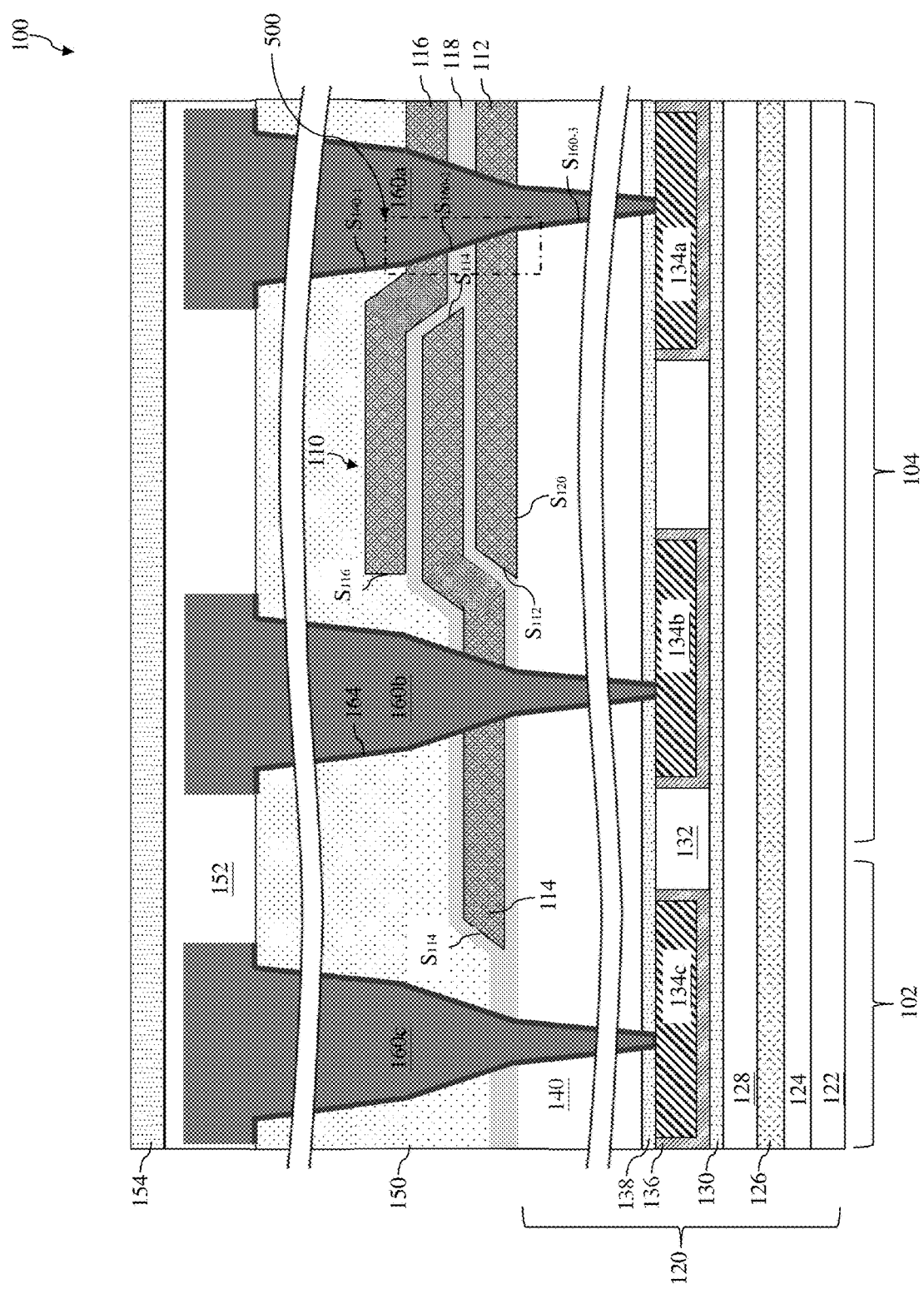
Figure 24:
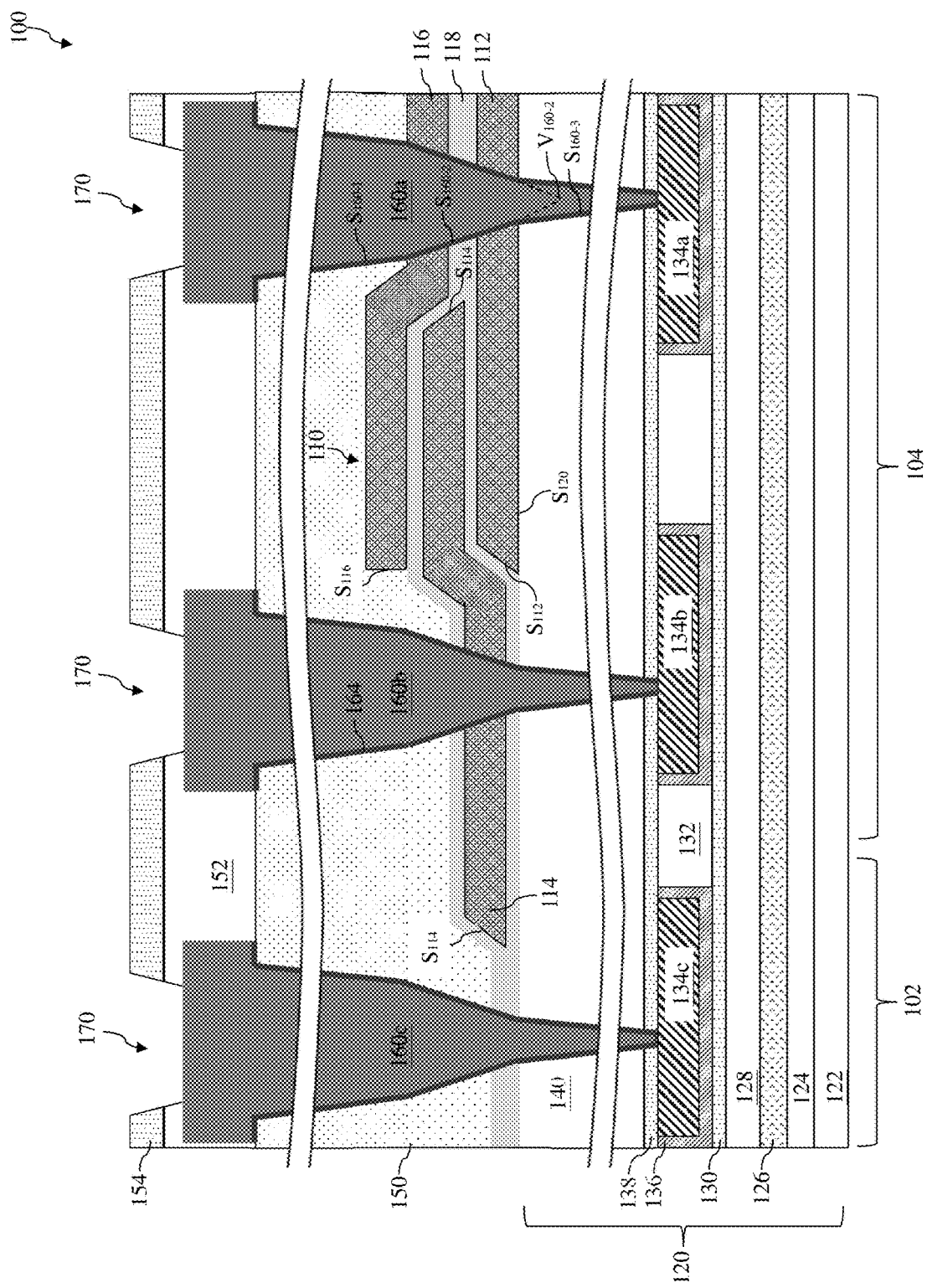

At operation 1314, the method 1300 (FIG. 13) forms contacts 160 in the openings 162 to provide connections to stack of layers of the MIM capacitor 110 in region 104 and other conductive features in region 102, as shown in FIG. 20. The contacts 160 may comprise tungsten, copper, aluminum, other suitable conductive material, or combinations thereof. The contacts 160 may be formed by suitable photolithography, etching, and/or deposition processes, such as chemical vapor deposition (CVD) or physical vapor deposition (PVD). In yet one embodiment, the formation of the contacts 160 may include a single damascene process or a dual damascene process. In one embodiment, the contacts 160 further include a liner layer 164. The liner layer 164 may include TaN, TiN, HfN, ZrN, WN, NbN, MoN, combinations thereof, and/or other suitable conductive material. The liner layer 164 may be formed by chemical vapor deposition (CVD), atomic layer deposition (ALD), physical vapor deposition (PVD), plating, and/or other suitable deposition processes.

Figure 26:
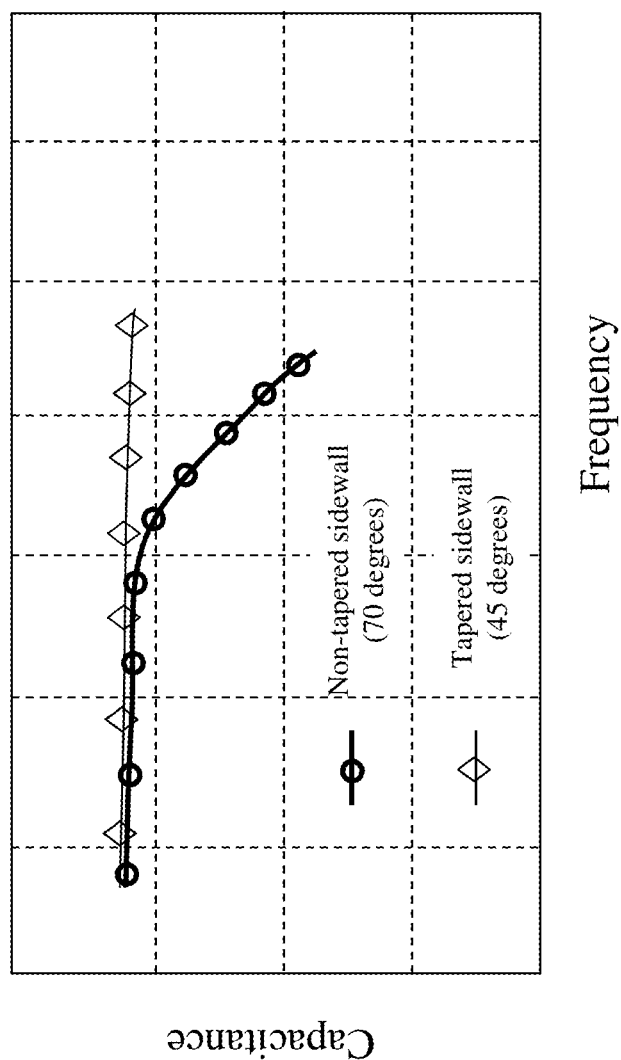
FIG. 26 illustrates capacitive frequency response comparison between various semiconductor structures.

A region 500 where the contact 160a interfaces with the MIM capacitor 110 through the middle sidewall $S_{160-2}$ is enlarged in FIG. 21. Referring to FIG. 21, the middle sidewall $S_{160-2}$ may have multiple segments interfacing with different material layers of the MIM capacitor 110 instead of one flat surface. In some embodiments, the segments includes sidewall $S'_{160-2}$ interfacing with the top electrode 116, sidewall $S''_{160-2}$ interfacing with the insulating dielectric layer 118, and sidewall S'''$_{160-2}$ interfacing with the bottom electrode 112. Each segment forms an angle with respect to the top surface S$_{120}$ of the semiconductor substrate 120 that is smaller than either the upper sidewall S$_{160-1}$ or the lower sidewall S$_{160-3}$. However, each segment may have a different angle due to a different etch rate when etching each respective material layer of the MIM capacitor 110. In the illustrated embodiment, the sidewall S''$_{160-2}$ is more tapered than either the sidewall S'$_{160-2}$ or the sidewall S'''$_{160-2}$ due to a slowest etch rate at the insulating dielectric layer 118. Sidewalls S'$_{160-2}$ and S'''$_{160-2}$ may be substantially parallel. An angle formed between the middle sidewall S$_{160-2}$ and the top surface S$_{120}$ can be calculated as an average angle θ between the three segments, where θ is considered as an angle between the top surface S$_{120}$ and the illustrated straight dotted line connecting two ends (e.g., points A and B) of the middle sidewall S$_{160-2}$. In some embodiments, the average angle θ is between about 30 degrees and about 70 degrees. Compared with the angle γ formed between the upper sidewall S$_{160-1}$ and the top surface S$_{120}$, the inventors of the present disclosure have observed that when θ is at least 20 degrees less than γ, a capacitive frequency response of the MIM capacitor 110 will be noticeably improved. As shown in FIG. 26, with a non-tapered sidewall (θ=γ=70 degrees), the capacitance of the MIM capacitor 110 rolls off quickly on the curve at higher frequencies. As a comparison, with a tapered sidewall (γ=70 degrees and θ=45 degrees), the capacitance of the MIM capacitor 110 substantially maintains even at higher frequencies. This is because by tapering the middle sidewall S$_{160-2}$, the contact area between the electrodes and the contact 160a is enlarged, which reduces contact resistance. Consequently, a capacitive frequency response of the MIM capacitor 110 is improved in a less resistive environment.

Operation 1310 of etching through the material layers of the MIM capacitor 110 may be controlled by a timer mode. In some embodiments, operation 1310 may under etch the bottom electrode 112, resulting in one end of the middle sidewall S$_{160-2}$ (point B) is above the top surface S$_{120}$ of the semiconductor substrate 120 (FIG. 22). Accordingly, the lower sidewall S$_{160-3}$ extends upwardly into the bottom electrode 112 and has physical contact with a lower portion of the bottom electrode 112. In some embodiments, operation 1310 may over etch into the semiconductor substrate 120, resulting in one end of the middle sidewall S$_{160-2}$ (point B) is below the top surface S$_{120}$ (FIG. 23). Accordingly, the middle sidewall S$_{160-2}$ extends downwardly into the semiconductor substrate 120 and has physical contact with an upper portion of the semiconductor substrate 120 (e.g., dielectric layer 140).

Referring back to FIG. 20, operation 1312 may also include forming a passivation layer 152 covering the contacts 160. The passivation layer 152 may comprise plasma-enhanced oxide (PEOX), plasma-enhanced USG (PE-USG), or the like. The passivation layer 152 may be formed by PECVD, FCVD, or other suitable methods.

Still referring to FIG. 20, at operation 1316, the method 1300 (FIG. 13) deposits a protective layer 154 covering the semiconductor device 100. The protective layer 154 provides protection to the underlying layers from various environmental contaminants. The protective layer 154 may comprise silicon nitride, silicon oxynitride, or the like. The protective layer 154 may be formed by LPCVD, PECVD, or other suitable methods.

At operation 1318, the method 1300 (FIG. 13) performs further steps to complete the fabrication of the semiconductor device 100. For example, the method 1300 may form openings 170 (FIG. 24) above the contacts 160 in a photolithography process and an etching process, in order to form bond wires or flip-chip landings to the contacts 160, thereby routing interconnections externally to form a complete IC.

Although not intended to be limiting, one or more embodiments of the present disclosure provide many benefits to a semiconductor device and the formation thereof. For example, embodiments of the present disclosure provide an MIM structure with tapered sidewalls (or referred to as slanted sidewalls) on electrodes to enhance break down voltage tailing performance. Embodiments of the present disclosure also provide interconnections to the MIM structure with tapered sidewalls which reduces contact resistance and expands capacitive frequency response. Furthermore, formation of this MIM structure can be easily integrated into existing semiconductor fabrication processes.

In one exemplary aspect, the present disclosure is directed to a metal-insulator-metal (MIM) capacitor structure. The MIM capacitor structure includes a semiconductor substrate; a bottom conductive layer above the semiconductor substrate, wherein the bottom conductive layer has a slanted sidewall with respect to a top surface of the semiconductor substrate; a top conductive layer above the bottom conductive layer, wherein the top conductive layer has a vertical sidewall with respect to the top surface of the semiconductor substrate; and an insulating layer interposed between the bottom conductive layer and the top conductive layer, wherein the insulating layer covers the slanted sidewall of the bottom conductive layer. In some embodiments, the slanted sidewall of the bottom conductive layer forms an angle between about 60 degrees and about 80 degrees with respect to the top surface of the semiconductor substrate. In some embodiments, the insulating layer is a high-k dielectric layer. In some embodiments, the MIM capacitor structure further includes a middle conductive layer interposed between the bottom conductive layer and the top conductive layer, wherein the middle conductive layer is embedded in the insulating layer. In some embodiments, the middle conductive layer also has a slanted sidewall with respect to the top surface of the semiconductor substrate. In some embodiments, the slanted sidewall of the middle conductive layer forms an angle between about 60 degrees and about 80 degrees with respect to the top surface of the semiconductor substrate. In some embodiments, the insulating layer has a first sub layer and a second sub layer above the first sub layer, and wherein the first and second sub layers include different material compositions. In some embodiments, the MIM capacitor structure further includes a conductive feature having a sidewall, the sidewall having a top portion, a middle portion, and a bottom portion, the middle portion of the sidewall being in physical contact with the insulating layer and the bottom conductive layer, wherein the middle portion of the sidewall is tapered with respect to the top portion of the sidewall. In some embodiments, the top portion and the bottom portion of the sidewall are substantially parallel. In some embodiments, the middle portion of the sidewall forms an angle between about 30 degrees and about 70 degrees with respect to the top surface of the semiconductor substrate. In some embodiments, extension lines along the middle portion of the sidewall intersect at a vertex, the vertex being above a bottom surface of the conductive feature.

In another exemplary aspect, the present disclosure is directed to a semiconductor device. The semiconductor device includes a bottom electrode disposed over a semiconductor substrate; a dielectric layer disposed over the bottom electrode; a top electrode disposed over the dielectric layer; and a via feature having a sidewall, a middle portion of the sidewall directly interfacing with the bottom electrode and the dielectric layer, the middle portion of the sidewall being tapered with respect to a top portion of the sidewall. In some embodiments, the middle portion of the sidewall forms an angle between about 30 degrees and about 70 degrees with respect to a top surface of the semiconductor substrate. In some embodiments, the semiconductor device further includes a middle electrode interposing the bottom electrode and the top electrode, wherein the middle portion of the sidewall also directly interfaces with the top electrode, and wherein the middle electrode is electrically isolated from the via feature. In some embodiments, the bottom electrode has a tapered sidewall tilting from a vertical direction of a top surface of the semiconductor substrate, and wherein the dielectric layer covers the tapered sidewall. In some embodiments, the top electrode has a vertical sidewall with respect to the top surface of the semiconductor substrate.

In yet another exemplary aspect, the present disclosure is directed to a method. The method includes providing a semiconductor substrate; forming a metal-insulator-metal (MIM) capacitor over the semiconductor substrate; depositing a dielectric layer over the MIM capacitor; forming an opening in the dielectric layer, wherein the opening has a first sidewall directly interfacing with the dielectric layer, the first sidewall forming a first angle with respect to a top surface of the semiconductor substrate; and extending the opening downwardly, wherein the opening has a second sidewall directly interfacing with the MIM capacitor, the second sidewall forming a second angle with respect to a top surface of the semiconductor substrate, the second angle being less than the first angle. In some embodiments, the forming of the opening and the extending of the opening downwardly include applying a plasma comprising an ion and a chemical etchant, wherein the chemical etchant has a higher flow rate during the extending of the opening downwardly than during the forming of the opening. In some embodiments, the chemical etchant comprising boron. In some embodiments, the forming of the MIM capacitor includes depositing a bottom conductive layer; patterning the bottom conductive layer, thereby forming a bottom electrode, wherein the patterning of the bottom conducive layer includes applying a plasma etching to taper a sidewall of the bottom electrode; depositing an insulating layer over the bottom electrode; depositing a top conductive layer over the insulating layer; and patterning the top conductive layer, thereby forming a top electrode.

The foregoing outlines features of several embodiments so that those ordinarily skilled in the art may better understand various aspects of the present disclosure. Those ordinarily skilled in the art should appreciate that they may readily use the present disclosure as a basis for designing or modifying other processes and structures for carrying out the same or similar purposes and/or achieving the same or similar advantages disclosed herein. Those ordinarily skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    providing a substrate;
    forming a bottom electrode over the substrate, wherein a terminal end of the bottom electrode has a tapered sidewall;
    depositing an insulating layer over the bottom electrode; and
    forming a top electrode over the insulating layer, wherein a terminal end of the top electrode has a vertical sidewall, and wherein the vertical sidewall of the top electrode is directly above the bottom electrode.

2. The method of claim 1, wherein the forming of the bottom electrode includes applying an ion etchant for physical bombardment together with a chemical etchant for chemical etching.

3. The method of claim 2, wherein the chemical etchant includes boron.

4. The method of claim 2, wherein the chemical etchant has a flow rate from about 30% to about 50% of a total etchant flow rate.

5. The method of claim 2, wherein the forming of the top electrode includes applying the ion etchant for physical bombardment but free of the chemical etchant.

6. The method of claim 1, further comprising:
    forming a middle electrode embedded in the insulating layer and between the top and bottom electrodes.

7. The method of claim 6, wherein a terminal end of the middle electrode has a tapered sidewall.

8. The method of claim 1, further comprising:
    depositing a dielectric layer over the top electrode;
    forming an opening in the dielectric layer, wherein the opening has a first sidewall directly interfacing with the dielectric layer, the first sidewall forming a first angle with respect to a top surface of the substrate; and
    extending the opening downwardly, wherein the opening has a second sidewall directly interfacing with the top electrode, the second sidewall forming a second angle with respect to a top surface of the substrate, the second angle being less than the first angle.

9. The method of claim 8, wherein the forming of the opening and the extending of the opening downwardly both include applying a plasma comprising an ion and a chemical etchant, wherein the chemical etchant has a higher flow rate during the extending of the opening downwardly than during the forming of the opening.

10. A method, comprising:
    providing a semiconductor substrate;
    depositing a first conductive layer over the semiconductor substrate;
    patterning the first conductive layer, thereby forming a bottom electrode with a slanted sidewall;
    depositing a second conductive layer over the bottom electrode;
    patterning the second conductive layer, thereby forming a middle electrode with a slanted sidewall at a terminal end of the middle electrode, wherein the slanted sidewall of the middle electrode is directly above the bottom electrode;
    depositing a third conductive layer over the middle electrode; and
    patterning the third conductive layer, thereby forming a top electrode with a vertical sidewall.

11. The method of claim 10, wherein each of the patterning of the first conductive layer, the patterning of the second conductive layer, and the patterning of the third conductive layer includes a combination of physical bombardment and chemical etching, wherein the patterning of the third conductive layer includes at least chemical etching.

12. The method of claim 11, wherein each of the patterning of the first conductive layer, the patterning of the second conductive layer, and the patterning of the third conductive layer includes applying an ion etchant for the physical bombardment and a chemical etchant for the chemical etching, wherein the ion etchant includes fluorine and the chemical etchant includes boron.

13. The method of claim 10, further comprising:
depositing a first insulating layer between the first conductive layer and the second conductive layer; and
depositing a second insulating layer between the second conductive layer and the third conductive layer.

14. The method of claim 13, wherein the first and second insulating layers include different material compositions.

15. The method of claim 10, wherein each of the slanted sidewall of the bottom electrode and the slanted sidewall of the middle electrode forms an angle between about 60 degrees and about 80 degrees with respect to a top surface of the semiconductor substrate.

16. A method, comprising:
providing a semiconductor substrate;
forming a metal-insulator-metal (MIM) capacitor over the semiconductor substrate, the MIM capacitor having at least a top electrode and a bottom electrode;
depositing a dielectric layer over the MIM capacitor;
forming an opening in the dielectric layer, wherein the opening has a first sidewall directly interfacing with the dielectric layer, the first sidewall forming a first angle with respect to a top surface of the semiconductor substrate; and
extending the opening downwardly, wherein the opening has a second sidewall directly interfacing with the MIM capacitor, the second sidewall forming a second angle with respect to the top surface of the semiconductor substrate, the second angle being less than the first angle, a bottommost portion of the top electrode being exposed by a portion of the second sidewall that forms the second angle.

17. The method of claim 16, wherein the forming of the opening and the extending of the opening downwardly include applying a plasma comprising an ion and a chemical etchant, wherein the chemical etchant has a higher flow rate during the extending of the opening downwardly than during the forming of the opening.

18. The method of claim 17, wherein the chemical etchant includes boron.

19. The method of claim 16, wherein the first angle ranges from about 70 degrees to about 90 degrees and the second angle ranges from about 30 degrees to about 70 degrees.

20. The method of claim 16, wherein the forming of the MIM capacitor includes:
depositing a bottom conductive layer;
patterning the bottom conductive layer, thereby forming the bottom electrode of the MIM capacitor, wherein the patterning of the bottom conductive layer includes applying a plasma etching to taper a sidewall of the bottom electrode;
depositing an insulating layer over the bottom electrode;
depositing a top conductive layer over the insulating layer; and
patterning the top conductive layer, thereby forming the top electrode of the MIM capacitor.

* * * * *